(12) United States Patent
Choi

(10) Patent No.: US 10,644,014 B2
(45) Date of Patent: May 5, 2020

(54) SEMICONDUCTOR DEVICE AND METHOD OF MANUFACTURING THE SAME

(71) Applicant: SK hynix Inc., Icheon-si, Gyeonggi-do (KR)

(72) Inventor: Kang Sik Choi, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/529,608

(22) Filed: Aug. 1, 2019

(65) Prior Publication Data

US 2019/0355734 A1    Nov. 21, 2019

Related U.S. Application Data

(63) Continuation of application No. 15/850,225, filed on Dec. 21, 2017, now Pat. No. 10,418,372.

(30) Foreign Application Priority Data

Jun. 16, 2017    (KR) ........................ 10-2017-0076719

(51) Int. Cl.
*H01L 27/11556* (2017.01)
*H01L 27/11541* (2017.01)
*H01L 27/11524* (2017.01)
*H01L 27/1157* (2017.01)
*H01L 27/11582* (2017.01)

(52) U.S. Cl.
CPC .... *H01L 27/11556* (2013.01); *H01L 27/1157* (2013.01); *H01L 27/11524* (2013.01); *H01L 27/11541* (2013.01); *H01L 27/11582* (2013.01)

(58) Field of Classification Search
CPC ......... H01L 27/11556; H01L 27/11524; H01L 27/11541; H01L 21/26513; H01L 21/266; H01L 27/11519; H01L 27/11565; H01L 27/1157; H01L 27/11582; H01L 29/408; H01L 29/0649; H01L 29/792; H01L 27/115–11597; G11C 16/24
See application file for complete search history.

(56) References Cited

U.S. PATENT DOCUMENTS

| 9,530,788 B2 | 12/2016 | Oginoe et al. |
|---|---|---|
| 9,627,405 B1 | 4/2017 | Lee |
| 2011/0199804 A1 | 8/2011 | Son et al. |
| 2015/0162342 A1* | 6/2015 | Lee .................. H01L 29/66833 257/324 |

(Continued)

FOREIGN PATENT DOCUMENTS

| KR | 1020120090356 A | 8/2012 |
|---|---|---|
| KR | 1020160020210 A | 2/2016 |

(Continued)

*Primary Examiner* — Shahed Ahmed
(74) *Attorney, Agent, or Firm* — William Park & Associates Ltd.

(57) ABSTRACT

A semiconductor device and a method of manufacturing a semiconductor device may be provided. The semiconductor device may include a source select line. The semiconductor device may include word lines. The semiconductor device may include a channel layer. The semiconductor device may include a source structure. The source structure may be disposed under the source select line. The source structure may be in contact with the channel layer.

19 Claims, 21 Drawing Sheets

(56) References Cited

U.S. PATENT DOCUMENTS

| | | |
|---|---|---|
| 2015/0318301 A1 | 11/2015 | Lee et al. |
| 2017/0148810 A1 | 5/2017 | Kai et al. |
| 2017/0338241 A1 | 11/2017 | Lee |
| 2018/0024948 A1* | 1/2018 | Tsai .................. G11C 16/3454 710/310 |
| 2018/0122904 A1* | 5/2018 | Matsumoto ....... H01L 27/11565 |
| 2018/0151672 A1 | 5/2018 | Choi et al. |
| 2018/0366483 A1 | 12/2018 | Choi |
| 2018/0366488 A1 | 12/2018 | Choi et al. |

FOREIGN PATENT DOCUMENTS

| | | |
|---|---|---|
| KR | 101652829 B1 | 9/2016 |
| KR | 1020170065290 A | 6/2017 |
| KR | 1020180137264 A | 12/2018 |
| KR | 1020180137272 A | 12/2018 |

* cited by examiner

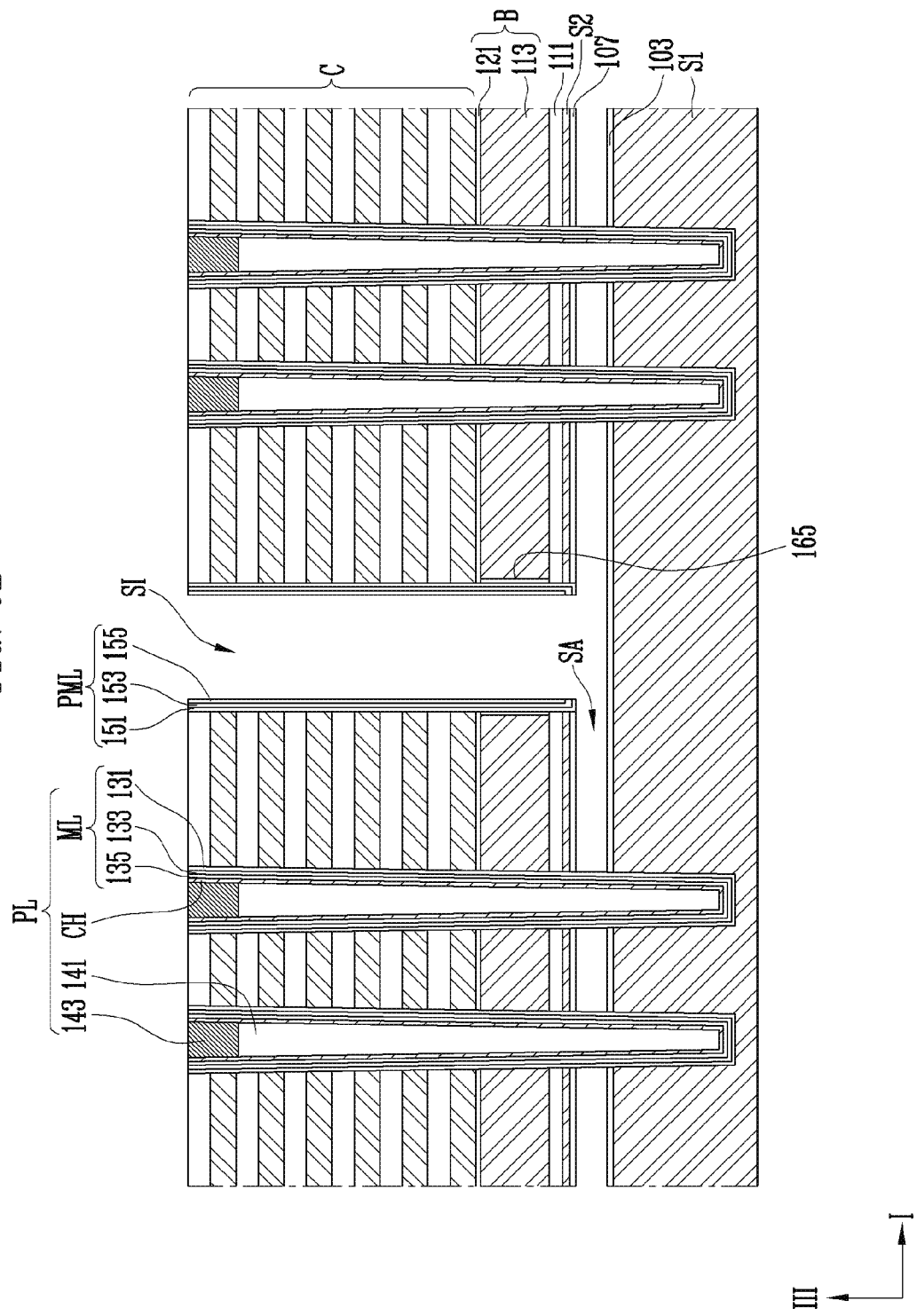

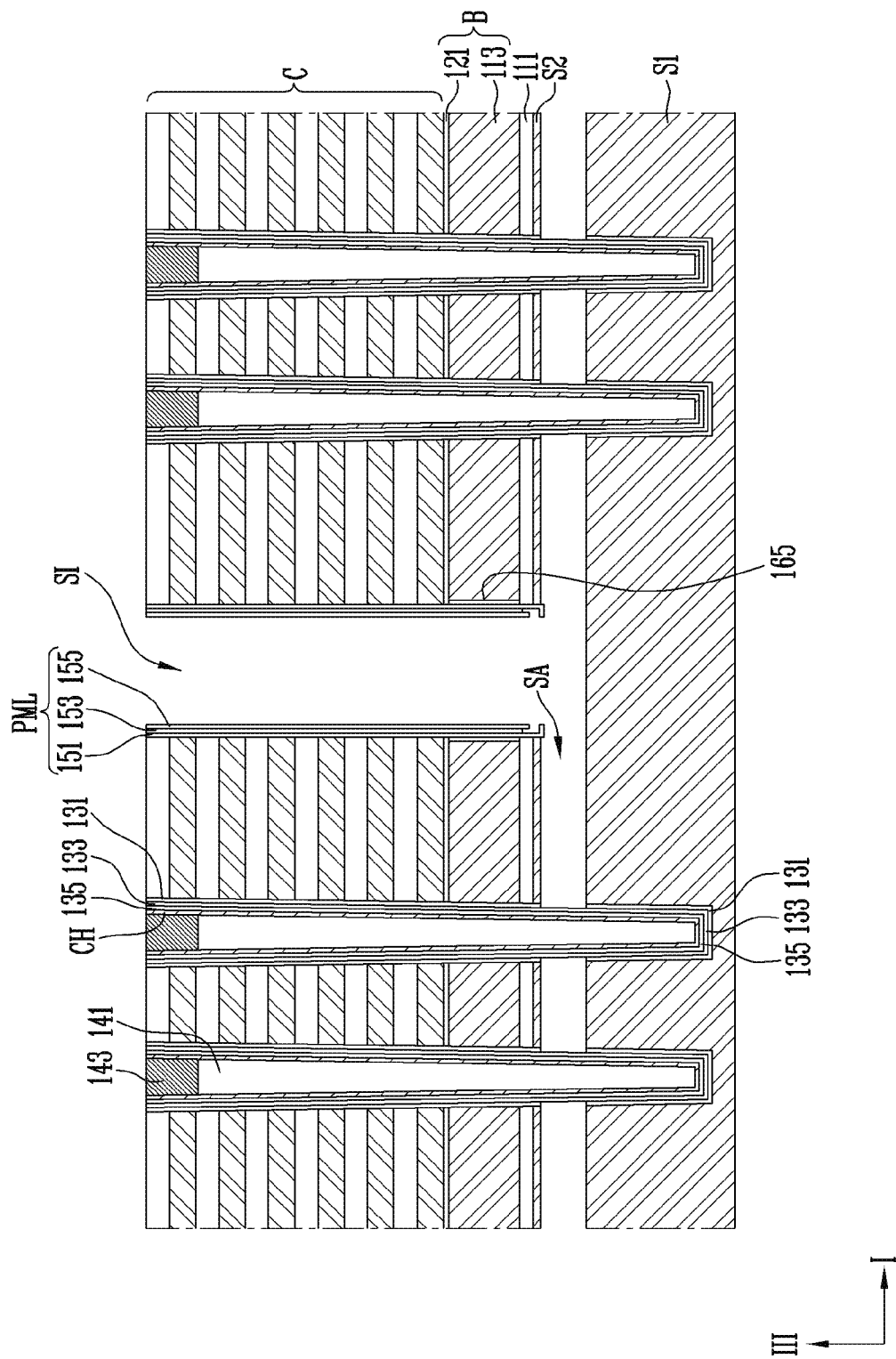

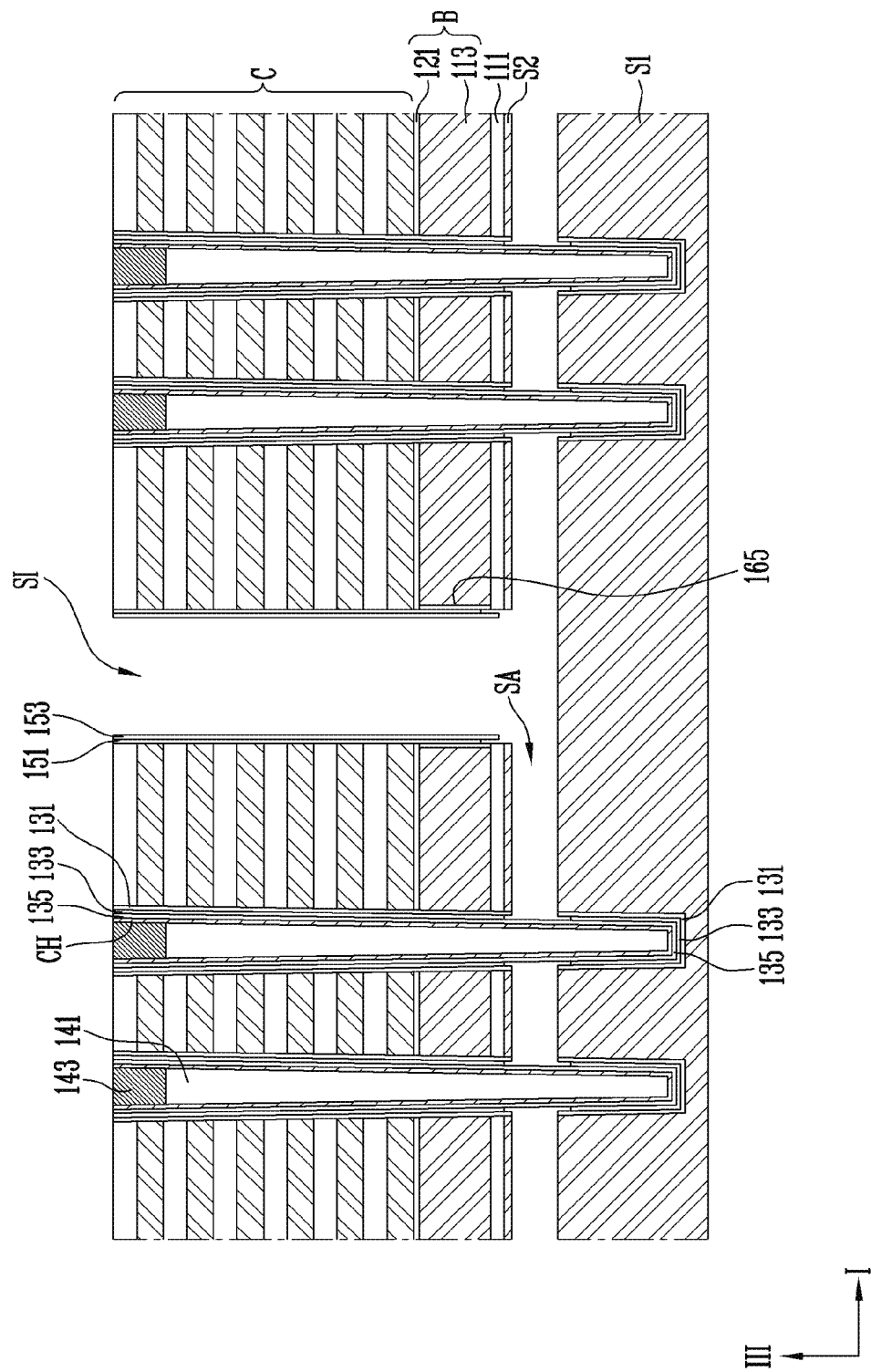

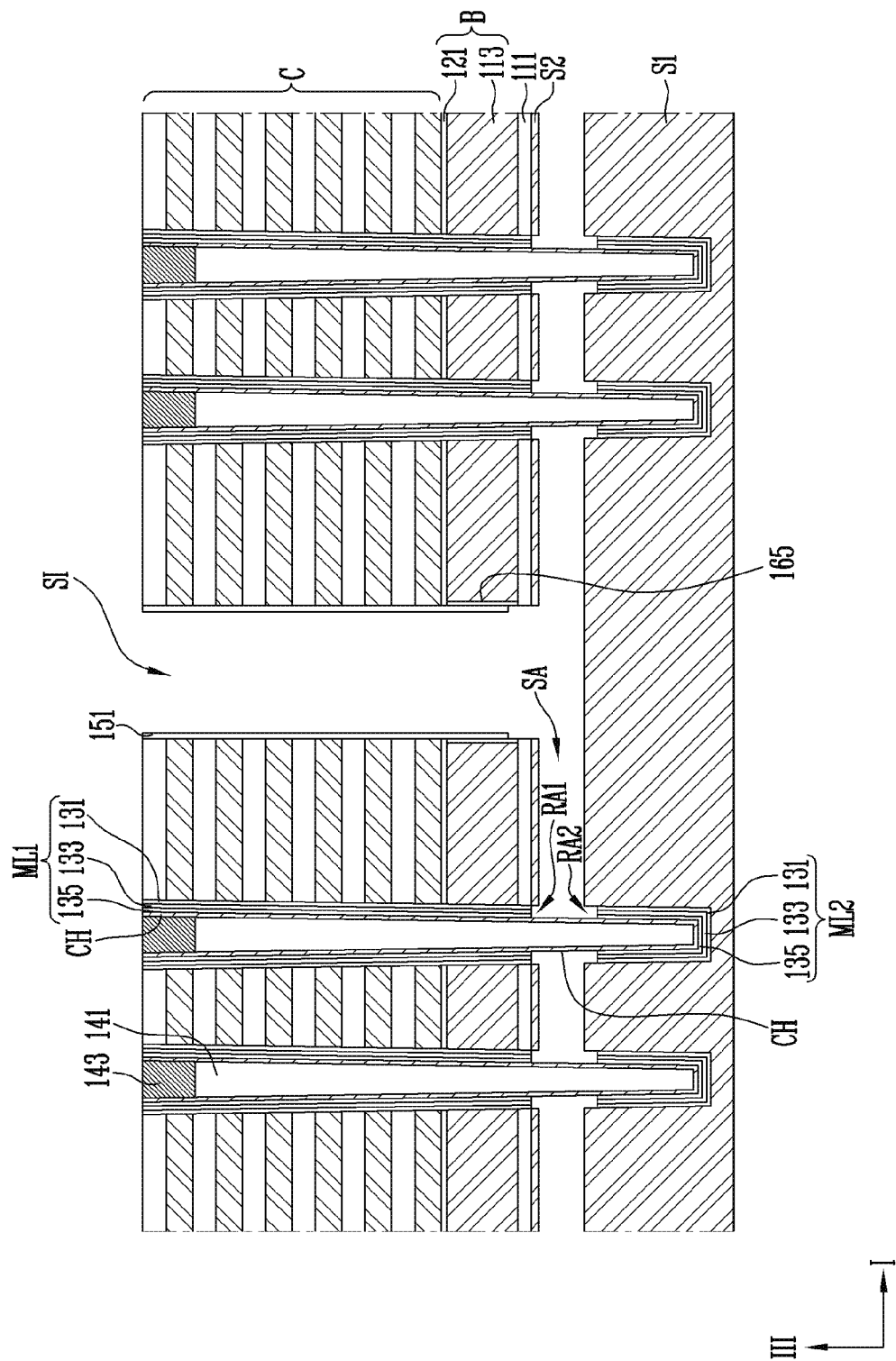

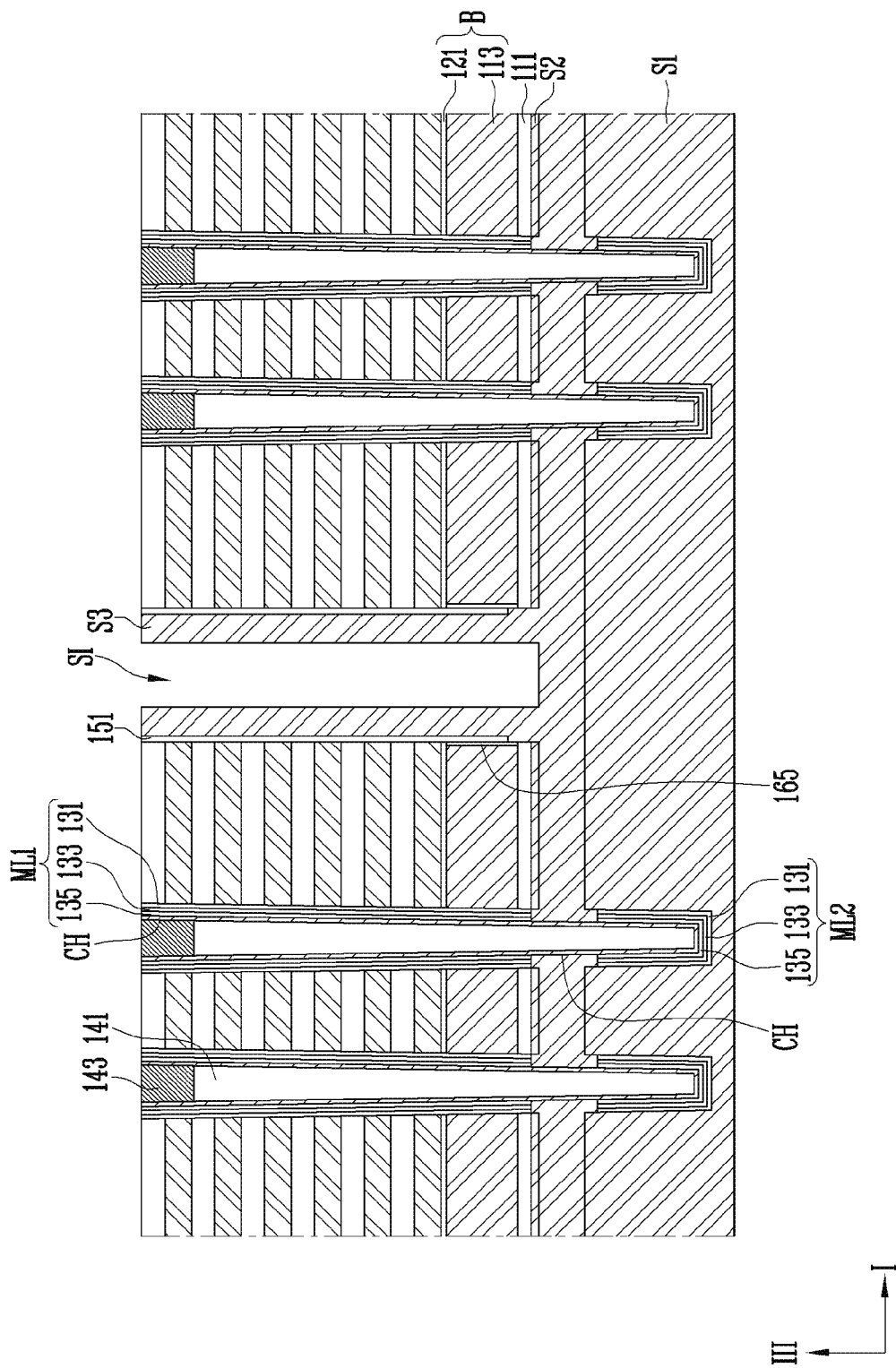

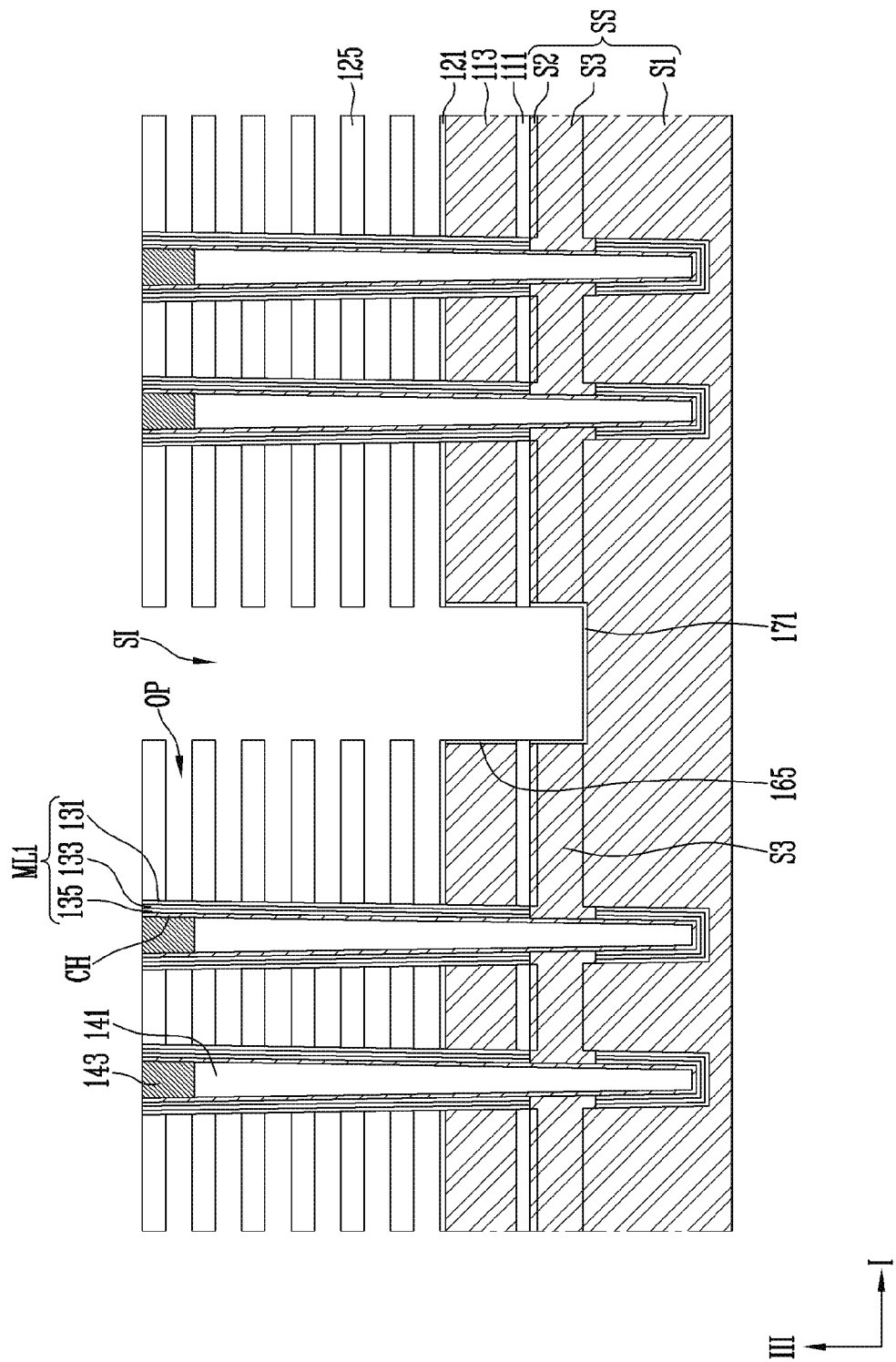

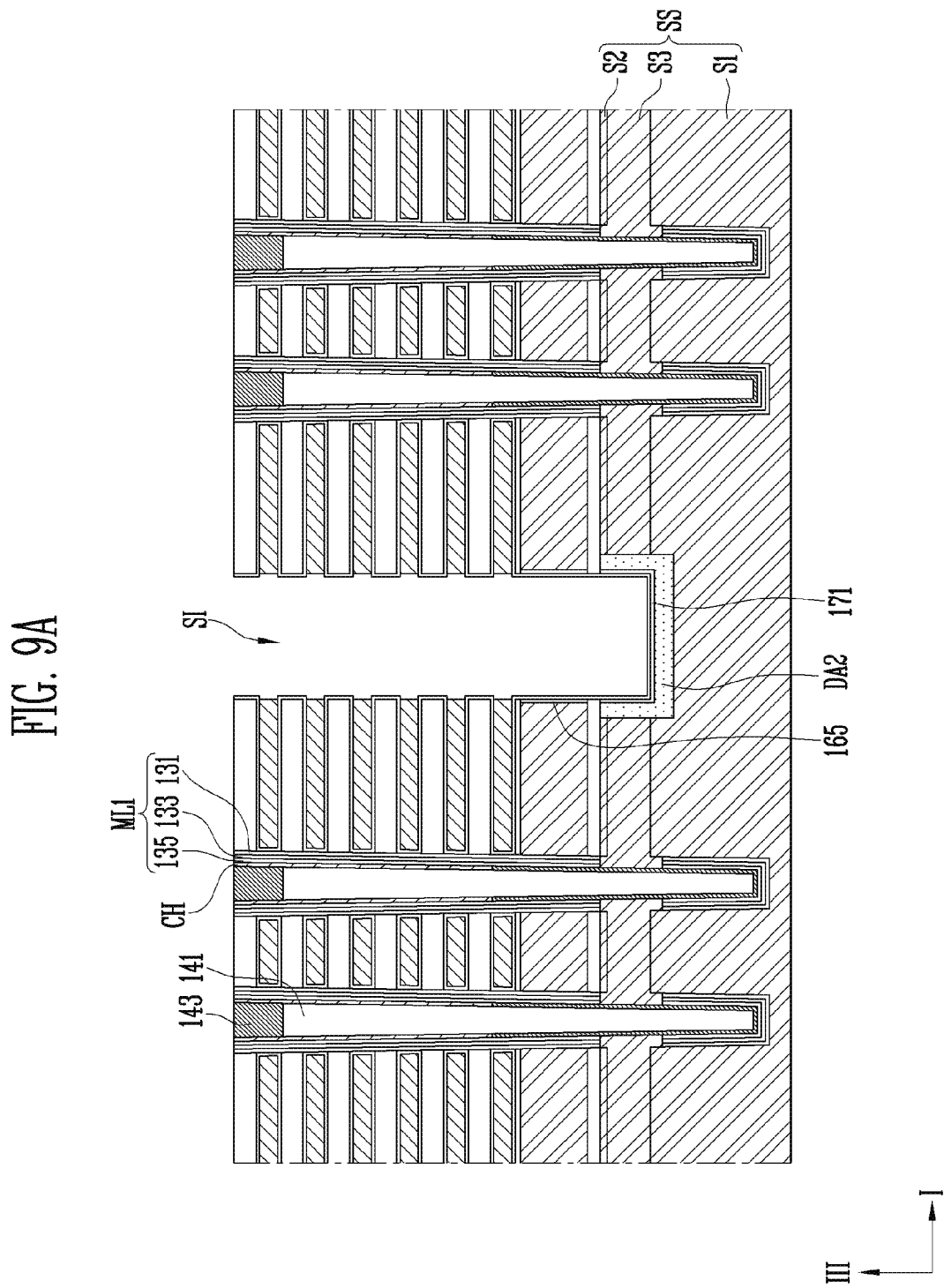

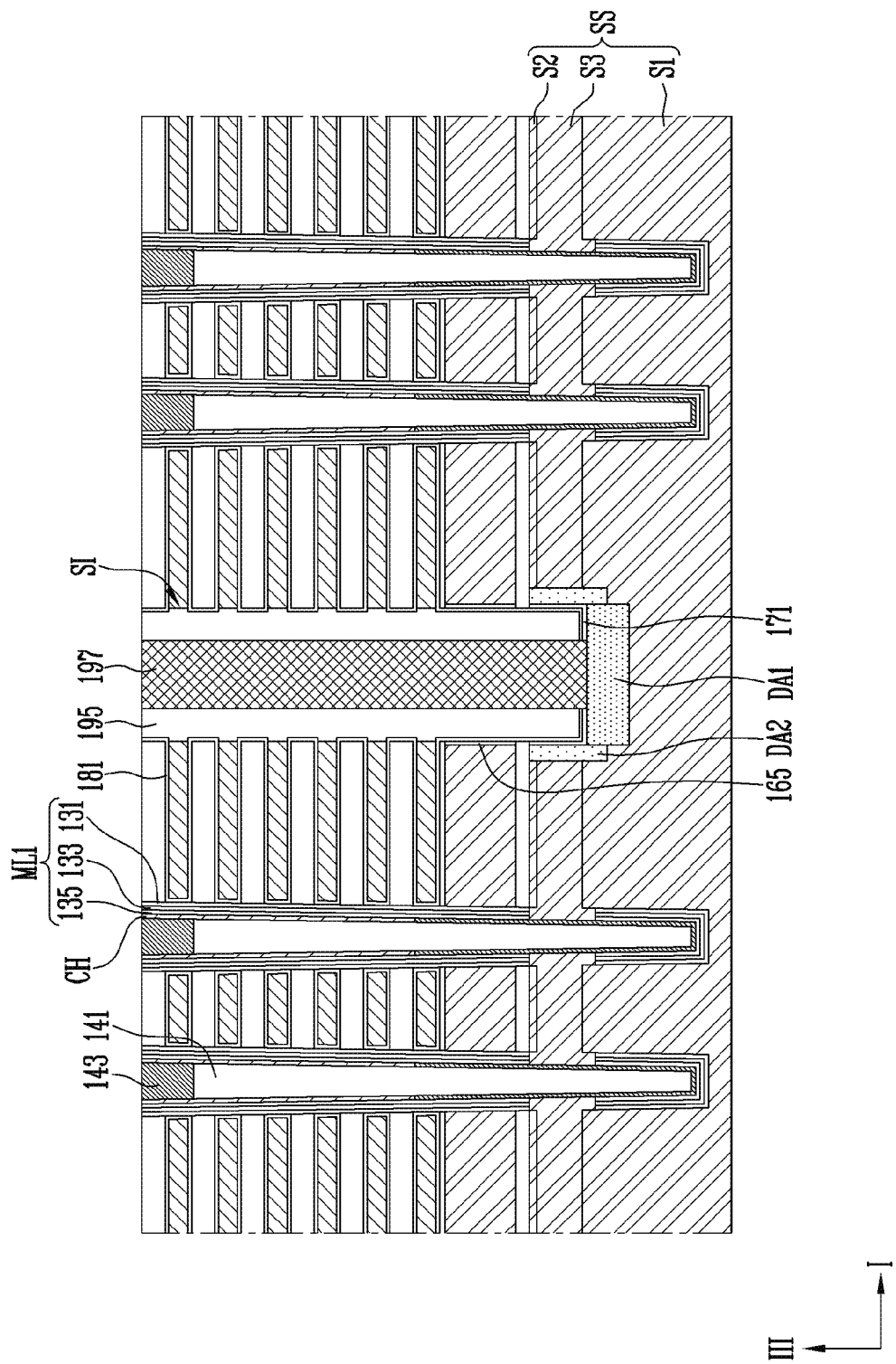

SEMICONDUCTOR DEVICE AND METHOD OF MANUFACTURING THE SAME

CROSS-REFERENCE TO RELATED APPLICATION

The present application is a continuation application of U.S. patent application Ser. No. 15/850,225, filed on Dec. 21, 2017, and claims priority under 35 U.S.C. § 119(a) to Korean patent application number 10-2017-0076719 filed on Jun. 16, 2017 in the Korean Intellectual Property Office, the entire disclosure of which is incorporated herein by reference.

BACKGROUND

1. Technical Field

The present disclosure may generally relate to a semiconductor device and a method of manufacturing the same, and more particularly, to a semiconductor device including a stacked body and a method of manufacturing the same.

2. Related Art

A semiconductor device includes a plurality of memory cell transistors which are capable of storing data. The memory cell transistors may be serially connected between select transistors and may be used to configure a memory string. To provide a high integration for the semiconductor device, a three-dimensional (3D) semiconductor device has been suggested. Gate electrodes of the memory cell transistors and the select transistors may be stacked to form the 3D semiconductor device. The 3D semiconductor device further includes a channel layer passing through the gate electrodes. In implementing the 3D semiconductor device, various technologies for improving operation reliability have been developed.

SUMMARY

In an embodiment, a semiconductor device may be provided. The semiconductor device may include a source select line including a first conductive layer and a second conductive layer disposed on the first conductive layer. The semiconductor device may include word lines stacked over the source select line while being spaced apart from one another. The semiconductor device may include a channel layer which may pass through the word lines and the source select line and further may protrude toward a lower direction than the source select line. The semiconductor device may include a source structure which may be disposed under the source select line and may be in contact with a lateral wall of the channel layer.

In an embodiment, of the present disclosure, a method of manufacturing a semiconductor device may be provided. The method may include forming a stack group including a first source layer, a sacrificial source layer on the first source layer, a gate insulating layer on the sacrificial source layer, a first conductive layer on the gate insulating layer, and first material layers and second material layers alternately stacked on the first conductive layer. The method may include forming a channel layer which may be extended into the first source layer while passing through the first material layers and the second material layers and may be surrounded by a multilayered memory layer. The method may include forming a first through portion which passes the first material layers and the second material layers by selectively etching the first material layers and the second material layers with a first etching material before the first conductive layer is passed through. The method may include forming a slit which may be extended from the first through portion and may pass through the first conductive layer and the gate insulating layer. The method may include replacing the sacrificial source layer with a contact source layer through the slit, the contact source layer being in direct contact with the first source layer and the channel layer and being insulated from the first conductive layer by the gate insulating layer.

BRIEF DESCRIPTION OF THE DRAWINGS

FIGS. 6A to 6E are cross-sectional views for describing step ST5 of the method illustrated in FIG. 3.

FIGS. 7A and 7B are cross-sectional views for describing step ST7 of the method illustrated in FIG. 3.

FIGS. 8A to 8C are cross-sectional views for describing step ST9 of the method illustrated in FIG. 3.

FIGS. 9A and 9B are cross-sectional views for describing step ST11 of the method illustrated in FIG. 3.

FIG. 10 is a cross-sectional view for describing step ST13 of the method illustrated in FIG. 3.

DETAILED DESCRIPTION

Figure 1:
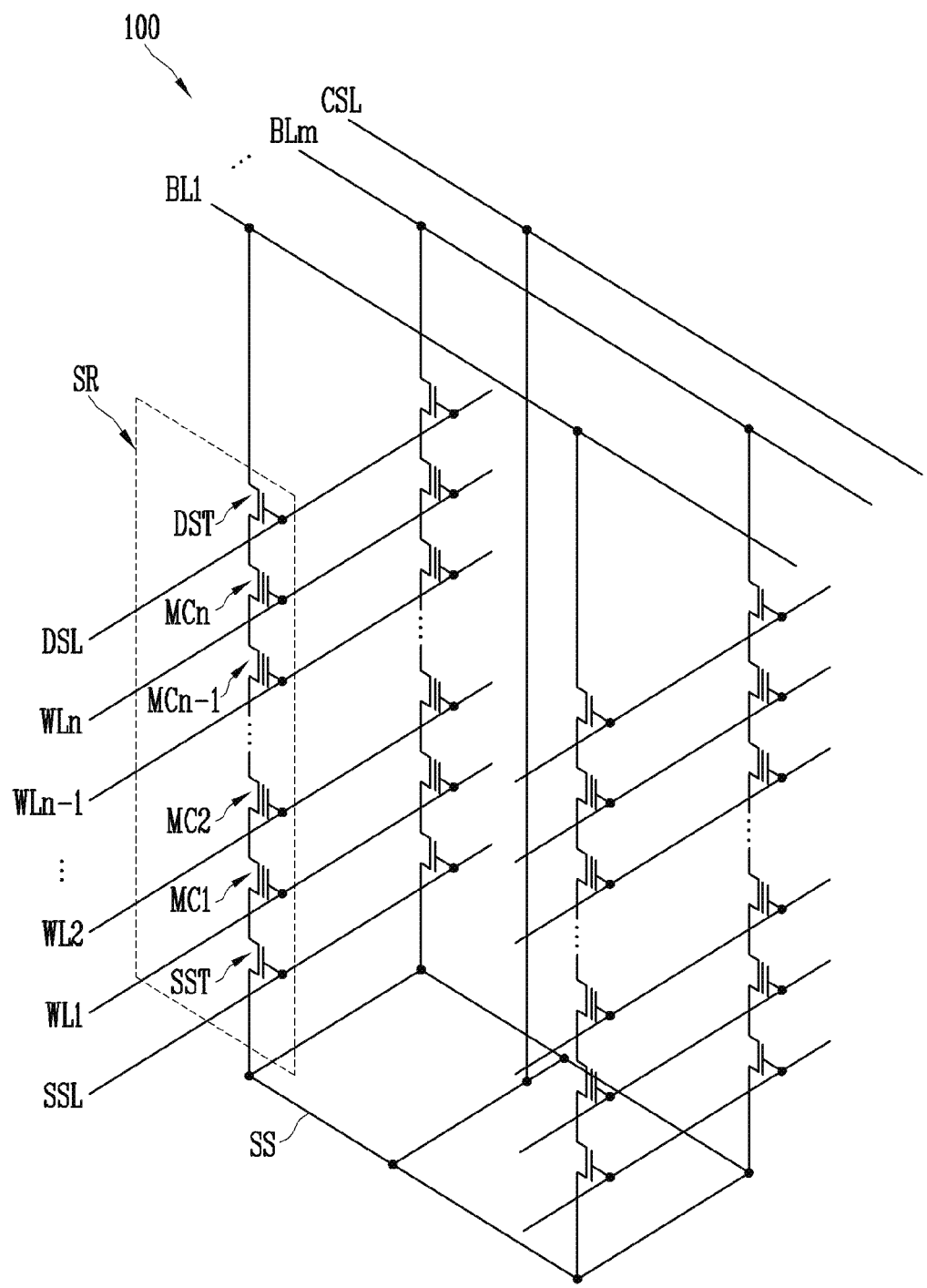
FIG. 1 is a schematic circuit diagram illustrating a semiconductor device according to an example of an embodiment of the present disclosure.

Hereinafter, examples of embodiments of the present disclosure will be described. In the drawings, the thicknesses and the intervals of elements are expressed for convenience of description, and may be exaggerated compared to an actual physical thickness. In describing the present disclosure, a publicly known configuration irrelevant to the principal point of the present disclosure may be omitted. It should note that in giving reference numerals to elements of each drawing, like reference numerals refer to like elements even though like elements are illustrated in different drawings.

Various embodiments may be directed to semiconductor device capable of improving operation reliability of a three-dimensional (3D) semiconductor device and a method of manufacturing the same.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

It is also noted that in this specification, "connected/ coupled" refers to one component not only directly coupling another component but also indirectly coupling another component through an intermediate component. On the other hand, "directly connected/directly coupled" refers to one component directly coupling another component without an intermediate component.

It is also noted that, "on" refers to one component not only directly on another component but also indirectly on another component through an intermediate component or intermediate components. On the other hand, 'directly on' refers to one component directly on another component without an intermediate component.

FIG. 1 is a schematic circuit diagram illustrating a semiconductor device according to an example of an embodiment of the present disclosure. FIG. 1 illustrates a circuit diagram of a NAND flash memory device.

Referring to FIG. 1, a semiconductor device according to an example of an embodiment of the present disclosure includes a memory cell array 100 having a three-dimensional (3D) structure. The memory cell array 100 includes a plurality of memory strings SR. Each of the memory strings SR may include a source select transistor SST, a plurality of memory cell transistors MC1 to MCn, and a drain select transistor DST which are serially connected. The number of source select transistors SST or the number of drain select transistors DST connected to each of the memory strings SR are not limited to one, and may be two or more.

The memory strings SR may be arranged in a matrix form in a row direction and a column direction. The memory strings SR may be connected to bit lines BL1 to BLm extended in the column direction. The memory strings SR may be connected to gate lines SSL, WL1 to WLn, and DSL extended in the row direction.

The source select transistor SST, the plurality of memory cell transistors MC1 to MCn, and the drain select transistor DST are serially connected by a channel layer to form one memory string SR. The memory strings SR may be disposed between the bit lines BL1 to BLm and a source structure SS. The gate lines SSL, WL1 to WLn, and DSL are stacked between the bit lines BL1 to BLm and the source structure SS, and are spaced apart from one another.

The gate lines may include the source select line SSL, the word lines WL1 to WLn, and the drain select line DSL. The source select line SSL is coupled to a gate electrode of the source select transistor SST. The word lines WL1 to WLn are coupled to gate electrodes of the memory cell transistors MC1 to MCn, respectively. The drain select line DSL is coupled to a gate electrode of the drain select transistor DST. The word lines WL1 to WLn are stacked while being spaced apart from one another, and the source select line SSL is disposed under the word lines WL1 to WLn and the drain select line DSL is disposed above the word lines WL1 to WLn. That is, the word lines WL1 to WLn are disposed between the source select line SSL and the drain select line DSL.

The source structure SS is disposed under the source select line SSL, and is connected to the source select transistor SST of the memory string SR. Each of the bit lines BL1 to BLm is connected to the drain select transistor DST of the memory string SR corresponding to each of the bit lines BL1 to BLm.

The memory strings SR commonly connected to one drain select line DSL are connected to different bit lines BL1 to BLm. Accordingly, when one drain select line DSL is selected and one of the bit lines BL1 to BLm is selected, one of the memory strings SR may be selected.

The source structure SS is electrically connected to the common source line CSL. The source structure SS may transmit an operation voltage applied to the common source line CSL to the memory strings SR. The electrical connection between the channel layer of the memory string SR and the source structure SS may be determined according to a signal applied to the source select line SSL.

Figure 2:
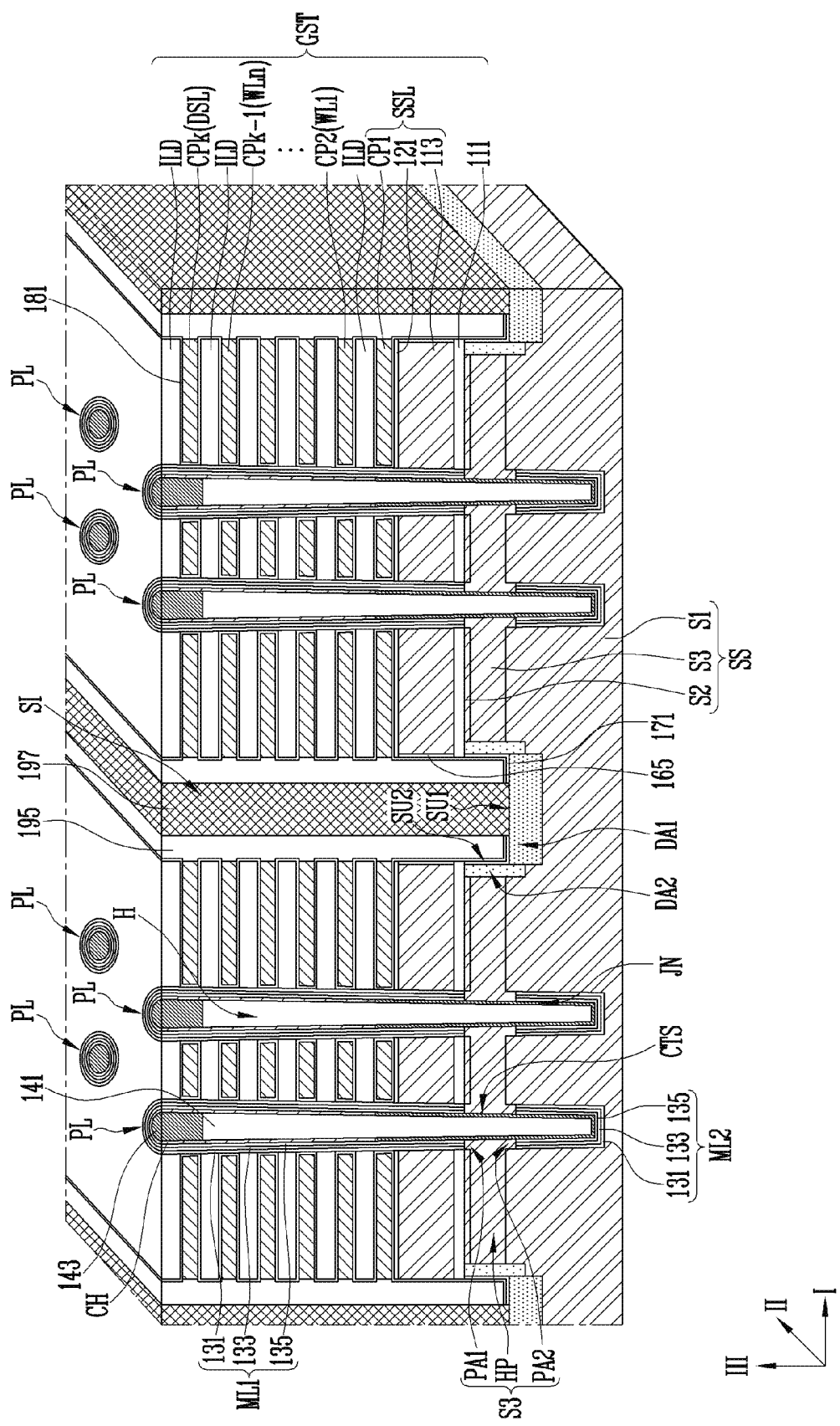
FIG. 2 is a perspective view illustrating a semiconductor device according to an example of an embodiment of the present disclosure.

FIG. 2 is a perspective view illustrating a semiconductor device according to an example of an embodiment of the present disclosure. Gate lines SSL, WL1 to WLn, and DSL illustrated in FIG. 2 correspond to the gate lines illustrated in FIG. 1, and a source structure SS illustrated in FIG. 2 corresponds to the source structure illustrated in FIG. 1.

Referring to FIG. 2, the semiconductor device according to an example of an embodiment of the present disclosure may include patterns extended in at least one direction of a first direction I, a second direction II, and a third direction III which cross one another. For example, the semiconductor device according to an example of an embodiment of the present disclosure may include a source structure SS extended in the first direction and the second direction II which cross each other, cell plugs PL extended from an internal side of the source structure SS in the third direction III, a gate stacked body GST surrounding the cell plugs PL, a slit SI passing through the gate stacked body GST, and a source contact line 197 disposed inside the slit SI and electrically connected to the source structure SS.

The gate stacked body GST includes insulating layers 111, 121, and ILD and conductive layers 113, CP1 to CPk which are alternately stacked one layer by turns in the third direction III. The insulating layers 111, 121, and ILD may include a gate insulating layer 111, an interface layer 121, and interlayer insulating layers ILD which are stacked while being spaced apart from one another. The conductive layers 113, and CP1 to CPk may include a first conductive layer 113, and second conductive layers CP1 to CPk which are stacked on the first conductive layer 113 while being spaced apart from one another.

The first conductive layer 113 is disposed to be closest to the source structure SS among the conductive layers 113, and CP1 to CPk. The first conductive layer 113 may be formed of a different conductive material from those of the second conductive layers CP1 to CPk. The second conductive layers CP1 to CPk are the group formed of the same conductive material.

The first conductive layer 113 may be formed of a material layer which may serve as an etch stopping layer in consideration of a forming process of the slit SI. For example, the first conductive layer 113 may be formed of a doped silicon layer including impurities of a first conductive type. The impurities of the first conductive type may be n-type impurities. The first conductive layer 113 is formed to be sufficiently thick to serve as an etch stopping layer during an etch process for forming the slit SI. For example, the first conductive layer 113 may be formed to be thicker than each of the second conductive layers CP1 to CPk and a second source layer S2 which is to be described below. For example, the first conductive layer 113 may be formed with a thickness of 500 Å or more in the third direction III.

The second conductive layers CP1 to CPk are formed of a conductive material having lower resistance than that of the first conductive layer 113. For example, the second conductive layers CP1 to CPk may include metal layers having low resistance. For example, the second conductive layers CP1 to CPk may include tungsten.

The first conductive layer 113 is used as a source select line SSL. The lowermost second conductive layer CP1 which is disposed to be closest to the first conductive layer 113 among the second conductive layers CP1 to CPk may be used as the source select line SSL. The topmost second conductive layer CPk which is disposed to be farthest from the first conductive layer 113 among the second conductive layers CP1 to CPk may be used as the drain select line DSL. The second conductive layers CP1 to CPk between the drain select line DSL and the source select line SSL may be used as the word lines WL1 to WLn. FIG. 2 illustrates the case where the second conductive layer CP1 of one layer is used as the source select line SSL and the second conductive layer CPk of one layer is used as the drain select line DSL, but the present disclosure is not limited thereto. That is, the second conductive layers of one or more layers which are sequentially disposed from the lowermost second conductive layer CP1 among the second conductive layers CP1 to CPk in an upper direction may be used as the source select line SSL, and the second conductive layers of one or more layers which are sequentially disposed from the topmost second conductive layer CPk in a lower direction may be used as the drain select line DSL. The word lines WL1 to WLn are stacked on the source select line SSL while being spaced apart from one another.

The insulating layers 111, 121, and ILD may be formed of an insulating material, such as an oxide layer. The gate insulating layer 111 is disposed to be closest to the source structure SS among the insulating layers 111, 121, and ILD, and the interface layer 121 is disposed between the interlayer insulating layers ILD and the gate insulating layer 111. For example, the gate insulating layer 111 is disposed between the source structure SS and the first conductive layer 113, and the interface layer 121 is disposed between the lowermost second conductive layer CP1 and the first conductive layer 113. The interlayer insulating layers ILD are disposed between the second conductive layers CP1 to CPk which are adjacent to one another in the third direction III. For example, the interlayer insulating layers ILD may be disposed between the lowermost layer word line WL1 among the word lines WL1 to WLn and the second conductive layer CP1 for the source select line SSL, and between the word lines WL1 and WLn which are adjacent to one another.

During the operation of the semiconductor device, the same operation voltage may be applied to the first conductive layer 113 and the lowermost second conductive layer CP1 included in the source select line SSL. The operation voltage designed to be applied to the source select line SSL is a gate voltage of a source select transistor, and may be applied to at least one of the first conductive layer 113 and the lowermost second conductive layer CP1. In an embodiment, for example, the operation voltage may induce coupling between the first conductive layer 113 and the lowermost second conductive layer CP1.

For example, the gate voltage of the source select transistor may be applied to both the first conductive layer 113 and the lowermost second conductive layer CP1. In order to apply the operation voltage to both the first conductive layer 113 and the lowermost second conductive layer CP1, a connection structure (not illustrated) for electrically connecting the first conductive layer 113 and the lowermost second conductive layer CP1 may be separately formed.

As another example, the gate voltage of the source select transistor may be applied to the first conductive layer 113 or the lowermost second conductive layer CP1. In order to easily apply the gate voltage of the source select transistor applied to any one of the first conductive layer 113 or the lowermost second conductive layer CP1 to the other, the interface layer 121 may be formed to be thin in the third direction III. For example, the interface layer 121 may be formed to be thinner than the gate insulating layer 111 and the interlayer insulating layers ILD in the third direction III. For example, the interface layer 121 may be formed in a thickness of 50 Å. When a process of replacing sacrificial layers with the second conductive layers CP1 to CPk is required, the interface layer 121 may be formed for protecting the first conductive layer 113. When the interface layer 121 is present, the operation voltage designed to be applied to the source select line SSL is set to induce coupling between the first conductive layer 113 and the lowermost second conductive layer CP1.

Although not illustrated, the interface layer 121 may be omitted. In this case, the first conductive layer 113 may be in direct contact with the lowermost second conductive layer CP1.

The gate insulating layer 111 may be formed with a thickness smaller than that of each of the interlayer insulating layers ILD.

The source structure SS is disposed under the source select line SSL. The source structure SS may be formed of one or more doped silicon layers including the first conductive type impurities. For example, the source structure SS may include a first source layer S1, a second source layer S2, and a contact source layer S3. Each of the first source layer S1, the second source layer S2, and the contact source layer S3 may be formed of a doped silicon layer including the first conductive type impurities with a first concentration. During an erase operation of the semiconductor device, in order to use a Gate Induced Drain Leakage (GIDL) method, the first conductive type impurities may be n-type impurities.

The second source layer S2 is disposed to be closest to the source select line SSL among the first source layer S1, the second source layer S2, and the contact source layer S3, and the first source layer S1 is disposed to be farthest from the source select line SSL among the first source layer S1, the second source layer S2, and the contact source layer S3. That is, the second source layer S2 is disposed to be closer to the source select line SSL than the first source layer S1. The contact source layer S3 is disposed between the first source layer S1 and the second source layer S2. The second source layer S2 may prevent the gate insulating layer 111 from being damaged during the progress of a process of exposing a lateral wall of a channel layer CH which is to be described below.

The gate stacked body GST is passed through by the slit SI. The slit SI may be extended into the source structure SS. For example, the slit SI may pass through the second source layer S2 and the contact source layer S3 and may be extended up to a surface of the first source layer S1. The slit SI may be extended from the surface of the first source layer S1 in the third direction III to pass through the gate stacked body GST.

Cell plugs PL may pass through the gate stacked bodies GST at both sides of the slit SI and may be extended into the source structure SS. Each of the cell plugs PL may include the channel layer CH, a first multi-layer memory pattern ML1, a second multi-layer memory pattern ML2, and a capping pattern 143.

The channel layer CH may pass through the gate stacked body GST and may further protrude toward the source structure SS, than the source select line SSL. For example, the channel layer CH may be extended into the first source layer S1. In an embodiment, for example, the channel layer CH may pass through the word lines WL and the source select line SSL and may further protrudes toward a lower direction than the source select line SSL. The channel layer CH may be formed of a semiconductor layer. For example, the channel layer CH may be formed of a silicon layer. The channel layer CH may include a lateral wall which is in direct contact with the source structure SS. Hereinafter, a portion, in which the lateral wall of the channel layer CH is in contact with the lateral wall of the source structure SS, is defined as a contact surface CTS.

The channel layer CH is disposed inside a hole H which passes through the gate stacked body GST. The channel layer CH may be a thin film which surrounds a core insulating layer 141 and is deposited along a surface of the hole H. The core insulating layer 141 may be formed with a smaller height than that of the channel layer CH. In this case, the semiconductor device may further include a capping pattern 143. The capping pattern 143 may be disposed on the core insulating layer 141 and may be formed to be filled in a center portion of an upper end of the channel layer CH. The capping pattern 143 may be in direct contact with the channel layer CH. The capping pattern 143 may be formed of a semiconductor layer in which the first conductive type impurities are doped. The first conductive type impurities may be n-type impurities. For example, the capping pattern 143 may be a doped silicon layer in which n-type impurities are doped. The capping pattern 143 may be used as a drain junction.

Although not illustrated, the capping pattern 143 and the core insulating layer 141 may be omitted. In this case, the channel layer CH may be formed to be completely filled in a center region of the hole H which passes through the gate stacked body GST.

The first multi-layer memory pattern ML1 and the second multi-layer memory pattern ML12 are formed to surround an external wall of the channel layer CH, and are isolated from each other by the source structure SS. The first multi-layer memory pattern ML1 may be extended along an interface between the channel layer CH and the gate stacked body GST. The second multi-layer memory pattern ML2 may be extended along an interface between the channel layer CH and the source structure SS.

Each of the first multi-layer memory pattern ML1 and the second multi-layer memory pattern ML2 may include a tunnel insulating layer 135 surrounding the channel layer CH, a data storing layer 133 surrounding the tunnel insulating layer 135, and a first blocking insulating layer 131 surrounding the data storing layer 133. The data storing layer 133 may store changed data by using fowler-nordheim tunneling caused by a voltage difference between the word lines WL1 to WLn and the channel layer CH. To this end, the data storing layer 133 may be formed of various materials, for example, a nitride layer in which charge trap is available. In addition, the data storing layer 133 may include silicon, a phase change material, nanodots, and the like. The first blocking insulating layer 131 may include an oxide layer which is capable of blocking charges.

A second blocking insulating layer 181 may be further formed in each of the interfaces between the insulating layers ILD and 121 and the second conductive layers CP1 to CPk and each of the interfaces between the first multi-layer memory pattern ML1 and the second conductive layers CP1 to CPk. The second blocking insulating layer 181 may be formed of an insulating material having a higher dielectric constant than that of the first blocking insulating layer 131. For example, the second insulating layer 181 may be formed of an aluminum oxide material. Although not illustrated, a barrier layer which prevents a direct contact between each of the second conductive layers CP1 to CPk and the second blocking insulating layer 181 may be further on the interface between each of the second conductive layers CP1 to CPk and the second blocking insulating layer 181. The barrier layer may include a titanium nitride layer, a tungsten nitride layer, a tantalum nitride layer, and the like. The operation voltage applied to the source select line SSL may induce coupling between the first conductive layer 113 and the lowermost second conductive layer CP1.

A part of the first multi-layer memory pattern ML1 disposed between the drain select line DSL and the channel layer CH and another part of the first multi-layer memory pattern ML1 disposed between the source select line SSL and the channel layer CH may be used as a gate insulating layer. The second multi-layer memory pattern ML2 may be used as an insulating layer between the source structure SS and the channel layer CH.

The contact surface CTS according to the example of an embodiment of the present disclosure is defined along the interface between the channel layer CH and the contact source layer S3. The first conductive type impurities inside the source structure SS are dispersed into the channel CH from the contact surface CTS to define the source junction JN inside the channel layer CH.

In order to secure a stable erase operation of the semiconductor device, a GIDL current needs to be sufficiently generated during the erase operation. To this end, the source junction JN according to the example of an embodiment of the present disclosure may be expanded up to a height, at which the source select line SSL is disposed, to overlap the source select line SSL. That is, the source junction JN may be expanded into the channel layer CH to face the lateral walls of the first conductive layer 113 and the lowermost second conductive layer CP1.

According to the example of an embodiment of the present disclosure, the first conductive layer 113 disposed on the second source layer S2 may serve as an etch stopping layer during the progress of the process for forming the slit SI. Accordingly, the function as the etch stopping layer may be excluded from the second source layer S2, so that the second source layer S2 may be formed to be thinner than each of the first conductive layer 113, the interlayer insulating layer ILD, and the second conductive layers CP1 to CP, and may be formed with a minimum thickness with which the gate insulating layer 111 may be protected. For example, the second source layer S1 may be formed with 100 Å. When a thickness of the second source layer S2 is decreased, a spaced distance between the contact surface CTS and the source select line SSL may be decreased. As a result, the first conductive type impurities may be easily dispersed from the contact surface CTS up to a height at which the source select line SSL is disposed. Accordingly, in the example of an embodiment of the present disclosure, the source junction JN may easily overlap the source select line SSL. Accordingly, in the example of an embodiment of the present disclosure, it may be possible to stably secure the erase operation of the semiconductor device, thereby improving reliability of an operation of the semiconductor device.

The contact source layer S3 may be completely filled in a space between the first source layer S1 and the second source layer S2. The contact source layer S3 may include a horizontal portion HP disposed between the first source layer S1 and the second source layer S2, a first protruding portion PA1 protruding from the horizontal portion HP toward the first multi-layer memory pattern ML1, and a second protruding portion PA2 protruding from the horizontal portion HP toward the second multi-layer memory pattern ML2. The horizontal portion HP, the first protruding portion PA1, and the second protruding portion PA2 are in contact with the channel layer CH. The first multi-layer memory pattern ML1 is disposed above the first protruding portion PA1 and the second multi-layer memory pattern ML2 is disposed under the second protruding portion PA2. The first protruding portion PA1 digs between the second source layer S2 and the channel layer CH, and the second protruding portion PA2 digs between the first source layer S1 and the channel layer CH. A part of the contact surface CTS defined by the first protruding portion PA1 may be extended up to a height, at which the interface of the gate insulating layer 111 and the source structure SS is disposed.

The semiconductor device may further include a lateral wall insulating layer 195 formed on the lateral wall of the slit SI. The lateral wall insulating layer 195 may be formed with a thickness which is sufficient to insulate the gate lines SSL, WL1 to WLn, and DSL from the source contact line 197, and may be formed of an oxide layer. The source contact line 197 is a conductive pattern for electrically connecting the source structure SS and the common source line CSL illustrated in FIG. 1. The source contact line 197 may be formed of various materials, such as a silicide layer, a metal layer, and a doped silicon layer.

The semiconductor device according to the example of an embodiment of the present disclosure may further include a first doping area DA1 formed from a first surface SU1 of the source structure SS, which is in contact with a bottom surface of the slit SI, with a first thickness. The first doping area DA1 is defined inside the source structure SS. The first doping area DA1 includes the first conductive type impurities, and may include the first conductive type impurities with a second concentration that is higher than the first concentration with which the first conductive type impurities are doped in the entirety of the source structure SS. The source contact line 197 may be in ohmic contact with the source structure SS by the first doping area DA1.

The semiconductor device according to the example of an embodiment of the present disclosure may further include a second doping area DA2 formed from a second surface SU2 of the source structure SS, which is in contact with the lateral wall of the slit SI, with a second thickness. The second doping area DA2 is defined inside the source structure SS. The second doping area DA2 may include the first conductive type impurities. The second doping area DA2 may include the first conductive type impurities with a third concentration that is higher than the first concentration and is lower than the second concentration in order to improve an electric characteristic of the semiconductor device.

The semiconductor device according to the example of an embodiment of the present disclosure may further include a first buffer layer 165 disposed between the lateral wall insulating layer 195 and the first conductive layer 113 and a second buffer layer 171 disposed between the lateral wall insulating layer 195 and the source structure SS.

According to the example of an embodiment of the present disclosure, the source select transistor is defined in a crossing portion of the source select line SSL and the channel layer CH, the memory cell transistors are defined in the crossing portions of the word lines WL1 to WLn and the channel layer CH, and the drain select transistor is defined in the crossing portion of the drain select line DSL and the channel layer CH.

Figure 3:
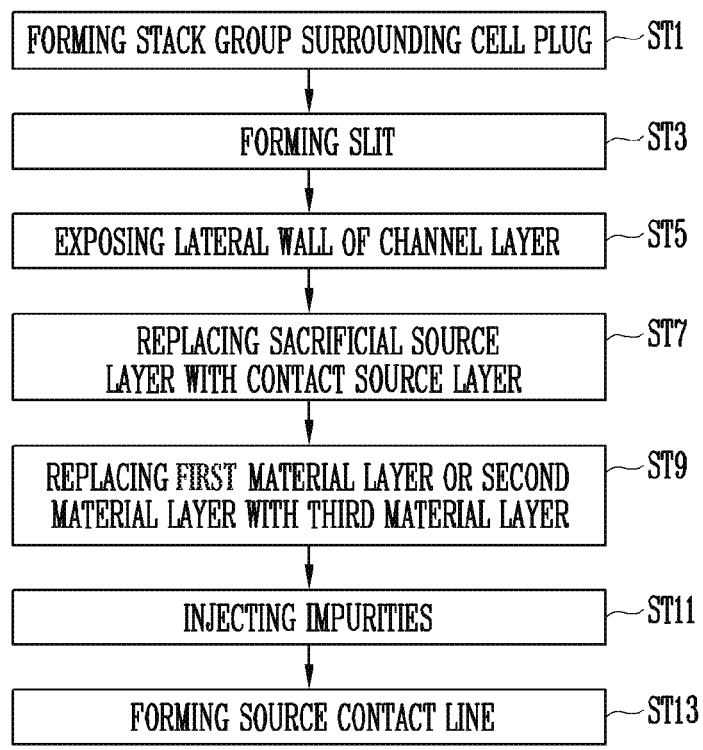
FIG. 3 is a flowchart schematically illustrating a method of manufacturing a semiconductor device according to an example of an embodiment of the present disclosure.

FIG. 3 is a flowchart schematically illustrating a method of manufacturing a semiconductor device according to an example of an embodiment of the present disclosure.

Referring to FIG. 3, step ST1 of forming a stack group surrounding a cell plug may be performed. Although not illustrated, before the performance of step ST1, driving transistors configuring a driving circuit for driving the semiconductor device may be formed on a substrate. In this case, step ST1 may be performed on the substrate including the driving transistors.

Figure 4:
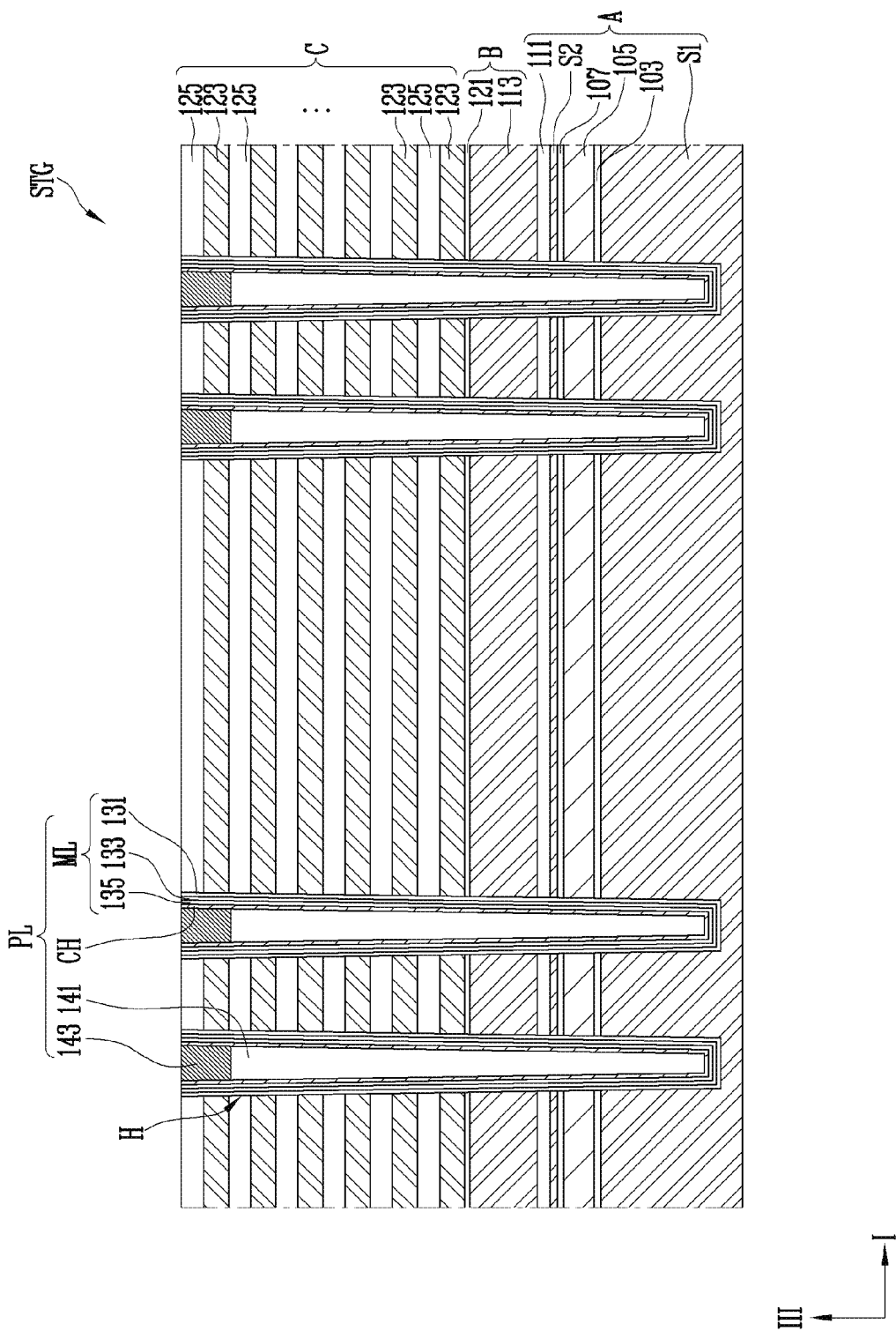
FIG. 4 is a cross-sectional view for describing step ST1 of the method illustrated in FIG. 3.

FIG. 4 is a cross-sectional view for describing step ST1 of the method illustrated in FIG. 3.

Referring to FIG. 4, step ST1 may include a step of forming a stack group STG including first to third stack bodies A to C, and a step of forming cell plugs PL passing through the stack group STG. The step of forming the stack group STG may include a step of forming a first stacked body A, a step of forming a second stacked body B on the first stacked body A, and a step of forming a third stacked body C on the second stacked body B.

The step of forming the first stacked body A may include a step of forming a first passivation layer 103 on a first source layer S1, a step of forming a sacrificial source layer 105 on the first passivation layer 103, a step of forming a second passivation layer 107 on the sacrificial source layer 105, a step of forming a second source layer S2 on the second passivation layer 107, and a step of forming a gate insulating layer 111 on the second source layer S2.

The first source layer S1 and the second source layer S2 may be doped silicon layers including the first conductive type impurities. The first passivation layer 103 and the second passivation layer 107 may be formed of a different material from that of the sacrificial source layer 105 to have a different etching rate from that of the sacrificial source layer 105. The sacrificial source layer 105 may be formed of a different material from that of the first source layer S1 or the second source layer S2 to have a different etching rate from that of the first source layer S1 or the second source layer S2. For example, the first passivation layer 103 and the second passivation layer 107 may be formed of an insulating material, and the sacrificial source layer 105 may be formed of an undoped semiconductor layer. For example, the first passivation layer 103 and the second passivation layer 107 may be formed of an oxide layer, and the sacrificial source layer 105 may be formed of an undoped silicon layer.

The first passivation layer 103 may be disposed between the first source layer S1 and the sacrificial source layer 105 to protect the first source layer S1 and prevent the first source layer S1 from being lost during the removal of the sacrificial source layer 105. The second passivation layer 107 and the second source layer S2 are sequentially stacked between the sacrificial source layer 105 and the gate insulating layer 111. The second passivation layer 107 may protect the second source layer S2 during the later removal of the sacrificial source layer 105 to prevent the second source layer S2 from being lost. The second source layer S2 may protect the gate insulating layer 111 during the etching of the multilayered memory layer ML to prevent the gate insulating layer 111 from being lost.

At least one of the first passivation layer 103, the second passivation layer 107, and the second source layer S2 may be omitted depending on the case.

The forming of the second stacked body B may include a step of forming the first conductive layer 113 on the first stacked body A. The first conductive layer 113 may be a doped silicon layer including the first conductive type impurities.

The forming of the second stacked body B may further include a step of forming an interface layer 121 on the first conductive layer 113.

The forming of the third stacked body C may include a step of alternately stacking first material layers 123 and second material layers 125 on the first conductive layer 113. The second material layers 125 are formed of a different material from that of the first material layers 123. When the interface layer 121 is formed, the interface layer 121 is disposed between the third stacked body C and the first conductive layer 113. One of the first material layers 123 is disposed on the lowermost layer of the third stacked body C.

The first material layers 123 may be formed of an insulating material for sacrifice, and the second material layers 125 may be formed of an insulating material for an interlayer insulating layer. For example, the first material layers 123 may be formed of silicon nitride layers, and the second material layers 125 may be formed of silicon oxide layers. When all of the first and second material layers 123 and 125 are formed of the insulating material, it may be possible to decrease a difficulty of subsequent etching processes for forming holes or slits.

Although not illustrated, the first material layers 123 may be formed of a conductive material for gate lines, and the second material layers 125 may be formed of an insulating material for an interlayer insulating layer. In this case, the first material layers 123 may be formed of a metal material having larger resistance than that of the first conductive layer 113. For example, the first material layers 123 may include tungsten.

The interface layer 121 may be formed of a different insulating material from that of the first material layers 123 to protect the first conductive layer 113 during the later removal of the first material layers 123 which are formed of an insulating material for sacrifice. For example, the interface layer 121 may be formed of an oxide layer.

The interface layer 121 may be formed with a small thickness to easily induce coupling, and for example, the interface layer 121 may be formed to be thinner than the second material layers 125 and the gate insulating layer 111.

The first conductive layer 113 may be formed of a different material from those of the first material layers 123 and the second material layers 125 to serve as an etching stopping layer during a process of forming a first through portion which is to be described below. For example, the first conductive layer 113 may be formed of a doped silicon layer including the first conductive type impurities. Further, the first conductive layer 113 may be formed to be thicker than each of the first material layers 123 and the second material layers 125 not to be completely passed through during the process of forming the first through portion which is to be described below.

In order to make a height of a contact surface of a contact source layer and the channel layer CH be closest to the first conductive layer 113, the second source layer S2 is formed to have a small thickness. For example, the second conductive layer S2 may be formed to be thinner than each of the first conductive layer 113, the first material layers 123, and the second material layers 125.

The forming of the cell plugs PL may include a step of forming holes H extended into the first source layer S1 while passing through the third stacked body C and the second stacked body B. The holes H pass through the gate insulating layer 111, the second source layer S2, the second passivation layer 107, the sacrificial source layer 105, and the first passivation layer 103 and are extended into the first source layer S1.

The forming of the cell plugs PL may include a step of forming the multilayered memory layer ML on a surface of each of the holes H. The multilayered memory layer ML may be formed by sequentially stacking a first blocking insulating layer 131, a data storing layer 133, and a tunnel insulating layer 135. The multilayered memory layer ML may be planarized to expose an upper surface of the stacked group STG.

The forming of the cell plugs PL may include a step of forming the channel layer CH on the multilayered memory layer ML. The forming of the channel layer CH may include a step of forming a semiconductor layer on the multilayered memory layer ML and a step of planarizing a surface of the semiconductor layer to expose the upper surface of the stacked group STG. The channel layer CH is formed inside each of the holes H. The channel layer CH may be formed to be completely filled in each of the holes H or may be formed to open a center region of each of the holes H.

When the center region of each of the holes H is opened by the channel layer CH, the step of forming the cell plugs PL may further include a step of filling the center region of each of the holes H with a core insulating layer 141.

The forming of the cell plugs PL may further include a step of forming a capping pattern 143 on the core insulating layer 141. To this end, an upper end of each of the holes H may be opened by recessing the upper end of the core insulating layer 141. Accordingly, a height of the core insulating layer 141 may be formed to be lower than each of the holes and the channel layer CH. Then, the capping pattern 143 filled in the upper end of each of the holes may be formed on the core insulating layer 141 having the decreased height. The capping pattern 143 may be formed of a doped silicon layer including the first conductive type impurities.

Through the processes of forming the cell plugs PL, the channel layer CH surrounded by the multilayered memory layer ML may be formed inside each of the holes H.

Referring to FIG. 3, after step ST1, step ST3 of forming the slit may be performed.

Figure 5A:
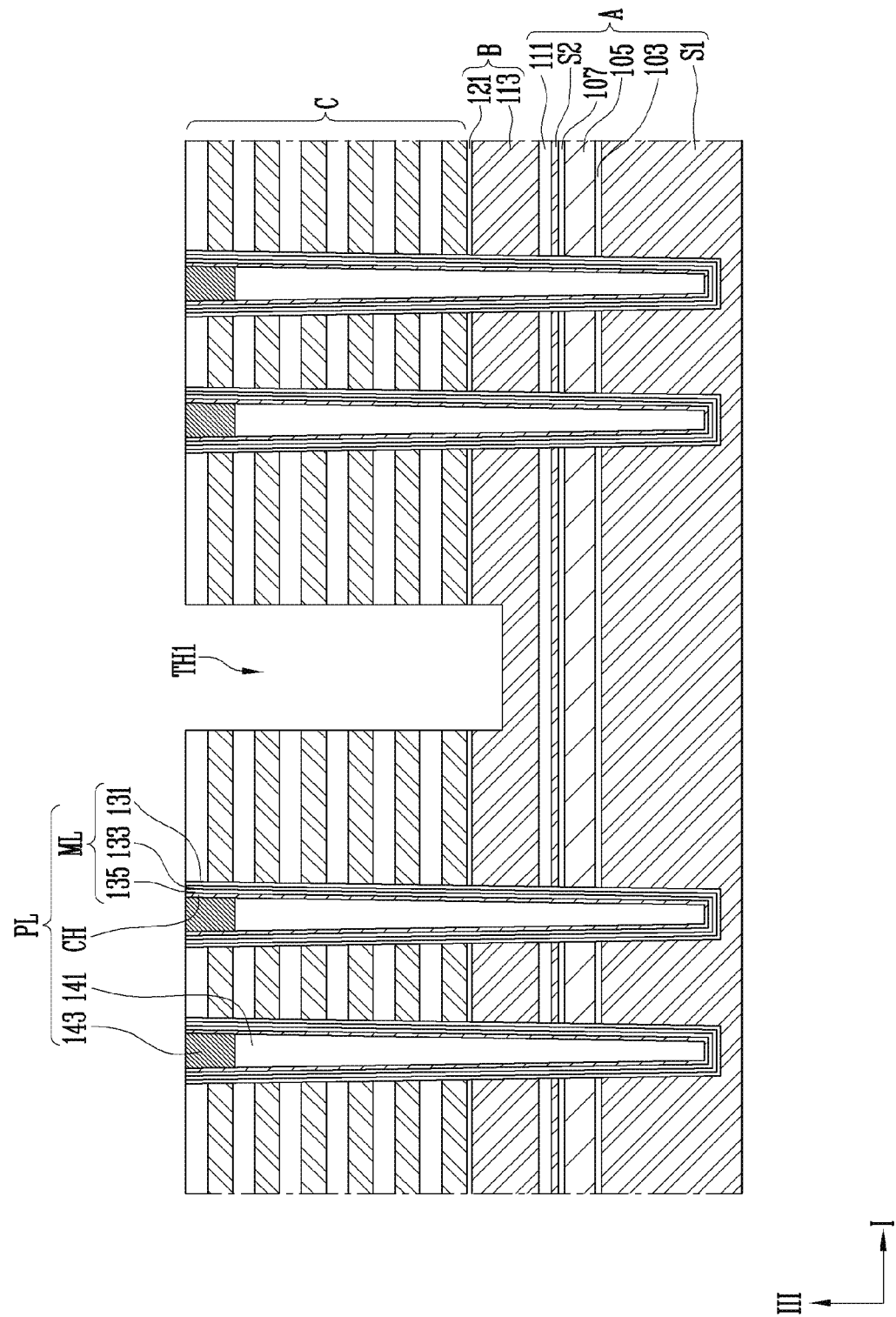
FIGS. 5A to 5C are cross-sectional views for describing step ST3 of the method illustrated in FIG. 3.
Figure 5B:
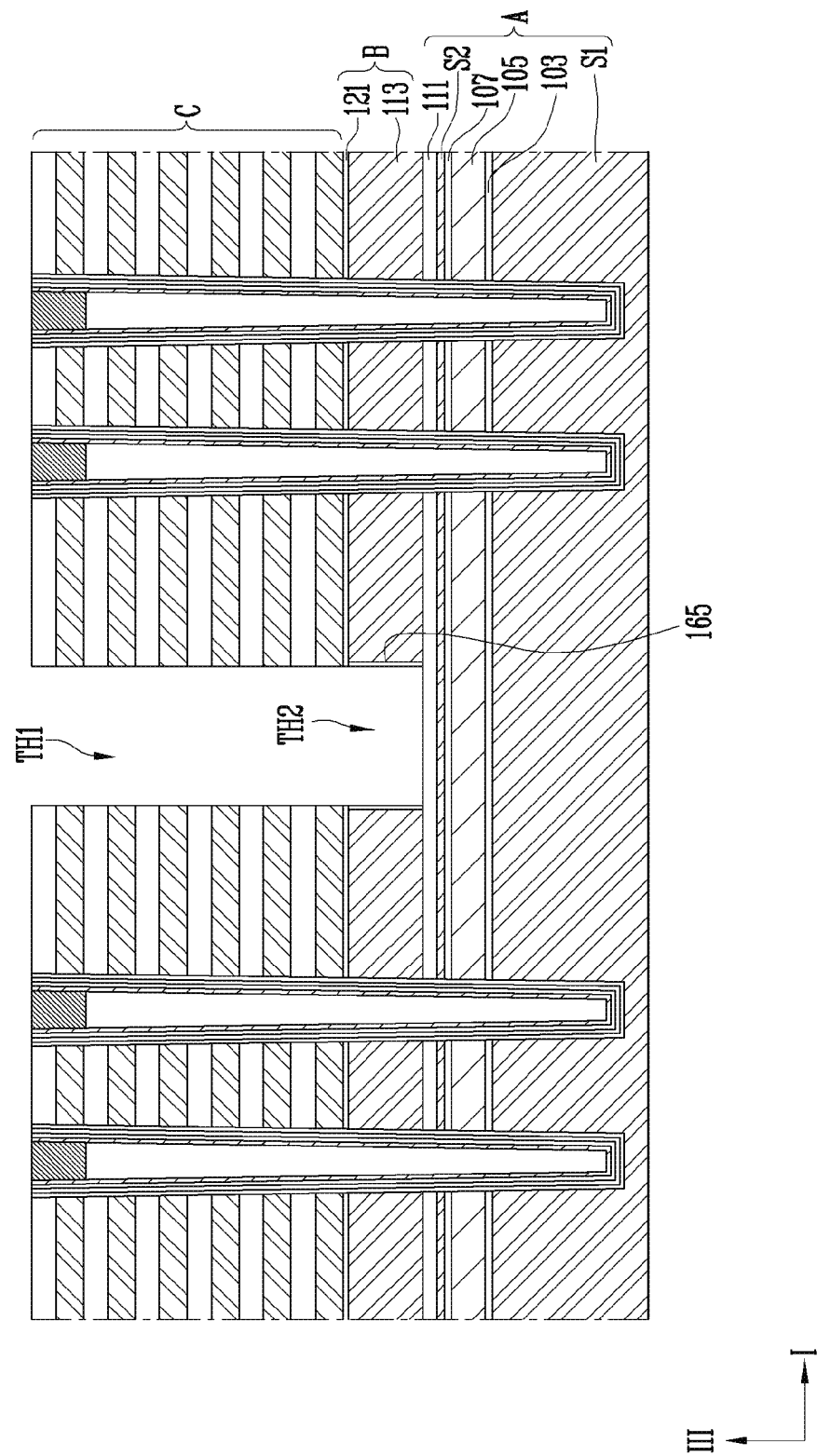
Figure 5C:
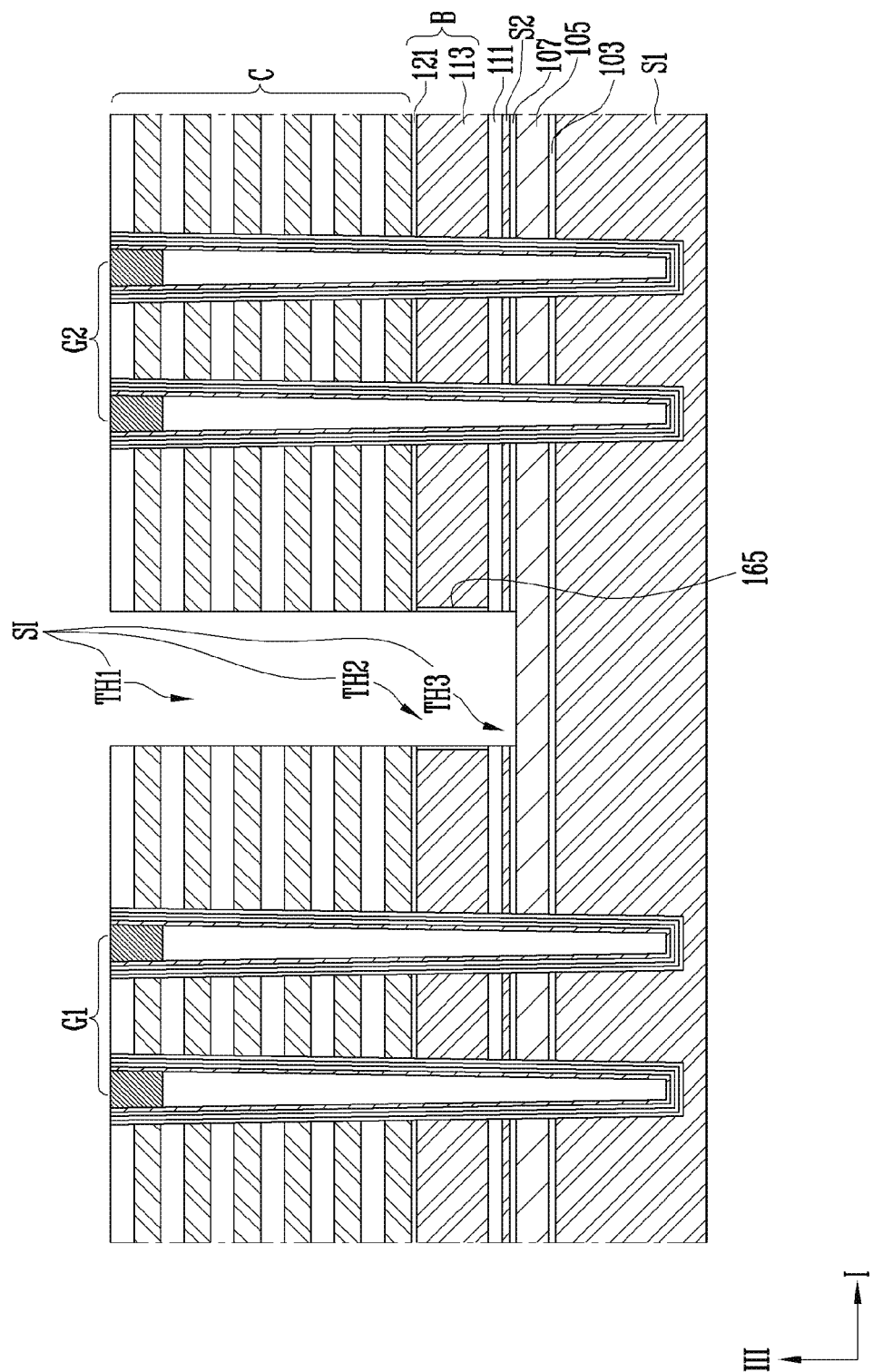

FIGS. 5A to 5C are cross-sectional views for describing step ST3 of the method illustrated in FIG. 3.

Referring to FIG. 5A, step ST3 may include a step of forming first through portions TH1 passing through the third stacked body C by selectively etching the third stacked body C with a first etching material before the first conductive layer 113 is passed through. The first through portion TH1 is a part of the slit.

The interface layer 121 may be further etched during the forming of the first through portion TH1. The first etching material is selected with a material which is capable of faster etching the third stacked body C than the first conductive layer 113. Accordingly, the first conductive layer 113 may serve as the etch stopping layer. Even though the first conductive layer 113 is partially lost by the first etching material, the first conductive layer 113 is formed to be thick sufficient to serve as the etch stopping layer, so that the first conductive layer 113 is not completely passed through by the first through portion TH1.

Referring to FIG. 5B, step ST3 may include a step of forming a second through portion TH2 by selectively etching the first conductive layer 113 with a second etching material before the gate insulating layer 111 is passed through. The second through portion TH2 is connected to the first through portion TH1 and passes through the first conductive layer 113 to expose the gate insulating layer 111. The second through portion TH2 is a part of the slit.

The second etching material is selected with a material which is capable of selectively etching the first conductive layer 113 without a loss of the gate insulating layer 111. Accordingly, the gate insulating layer 111 may serve as an etch stopping layer and is not completely passed through by the second through portion TH2.

After the second through portion TH2 is formed, a first buffer layer 165 may be formed by oxidizing a lateral wall of the first conductive layer 113 that is exposed through the second through portion TH2. The first buffer layer 165 may protect the first conductive layer 113 from subsequent processes.

Referring to FIG. 5C, step ST3 may include a step of forming a third through portion TH3 to expose the sacrificial source layer 105 by etching the gate insulating layer 111, the second source layer S2, and the second passivation layer 107. The third through portion TH3 is connected to the second through portion TH2 and is a part of the slit SI. That is, the slit SI may be defined as a connection structure of the first to third through portions TH1 to TH3. The first to third through portions TH1 to TH3 may be extended in the same direction, and for example, may be extended in the second direction II illustrated in FIG. 2. The first to third through portions TH1 to TH3 are serially disposed in the third direction III.

The slit SI is extended from the first through portion TH1 to pass through the first conductive layer 113 and the gate insulating layer 111 and exposes the sacrificial source layer 105. The slit SI may isolate each of the third stacked body C and the second stacked body B into a first block stacked body surrounding cell plugs G1 of a first group and a second block stacked body surrounding cell plugs G2 of a second group.

Referring to FIG. 3, after step ST3, step ST5 of exposing a lateral wall of the channel layer may be performed.

FIGS. 6A to 6E are cross-sectional views for describing step ST5 of the method illustrated in FIG. 3.

Figure 6A:
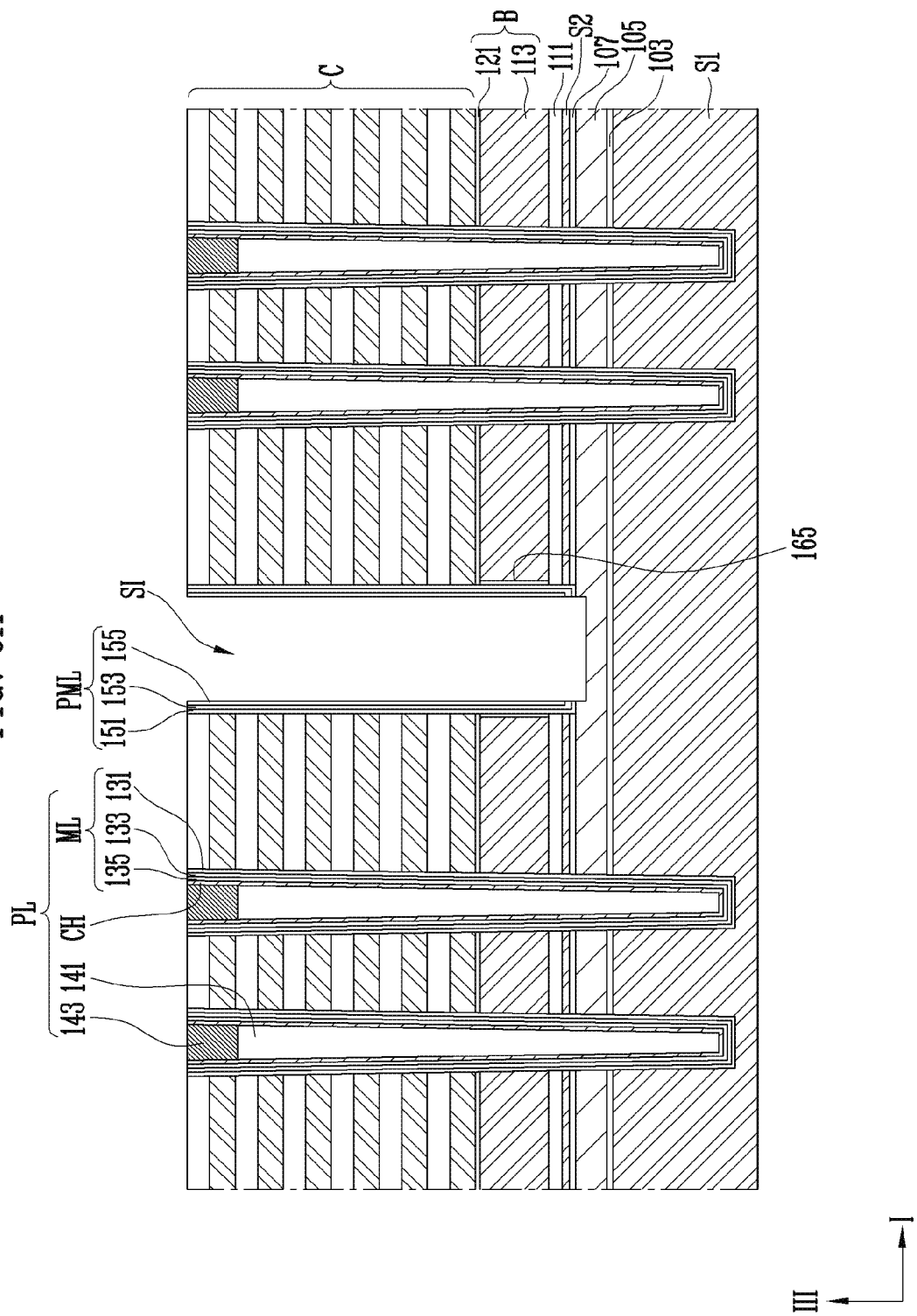

Referring to FIG. 6A, step ST5 may include a step of forming a multilayer passivation layer PML on the lateral wall of the slit SI.

The multilayer passivation layer PML may include a first lateral wall layer 151, a second lateral wall layer 153, and a third lateral wall layer 155 which are sequentially stacked. The first lateral wall layer 151 may be formed of an insulating material having a different etching rate from that of the first blocking insulating layer 131, the second lateral wall layer 153 may be formed of an insulating material having a different etching rate from that of the data storing layer 133, and the third lateral wall layer 155 may be formed of an insulating material having a different etching rate from that of the tunnel insulating layer 135. The first lateral wall layer 151 and the third lateral wall layer 155 may be formed of the same material as that of the data storing layer 133. As a particular example, the first lateral wall layer 151 and the third lateral wall layer 155 may be formed of a nitride layer. The second lateral wall layers 153 may be formed of an oxide layer.

The multilayer passivation layer PML may be removed from a bottom surface of the slit SI through an etch-back process. Accordingly, the sacrificial source layer 105 may be exposed.

Referring to FIG. 6B, step ST5 may include a step of removing the sacrificial layer 105 through the slit SI. Accordingly, a source area SA exposing the multilayered memory layer ML may be opened between the first passivation layer 103 and the second passivation layer 107.

During the removal of the sacrificial source layer 105, the first source layer S1 and the second source layer S2 may be protected by the first passivation layer 103 and the second passivation layer 107 having a different etching rate from that of the sacrificial source layer 105. Further, each of the third stacked body C, the second stacked body B, the gate insulating layer 111, and the second source layer S2 may be protected by the multilayer passivation layer PML.

Referring to FIG. 6C, step ST5 may include a step of removing a part of the first blocking insulating layer 131 between the first source layer S1 and the second source layer S2. In this case, the etching material may be introduced through the slit SI and the source area SA. The etching of the first blocking insulating layer 131 is performed until the data storing layer 133 is exposed through the source area SA.

During the etching of the first blocking insulating layer 131, the first passivation layer 103 and the second passivation layer 107 may be removed to expose the first source layer S1 and the second source layer S2. During the etching of the first blocking insulating layer 131, a part of the second lateral wall layer 153 adjacent to the source area SA may be removed. In the meantime, the first lateral wall layer 151 and the third lateral wall layer 155 having different etching rates from that of the first blocking insulating layer 131 are not etched while the data storing layer 133 is exposed by etching the first blocking insulating layer 131.

Referring to FIG. 6D, step ST5 may include a step of removing a part of the data storing layer 133 between the first source layer S1 and the second source layer S2. In this case, the etching material may be introduced through the slit SI and the source area SA. The etching of the data storing layer 133 is performed until the tunnel insulating layer 135 is exposed through the source area SA. An etching area of the data storing layer 133 may be dug between the tunnel insulating layer 135 and the residual first blocking insulating layer 131 and extended.

During the etching of the data storing layer 133, the third lateral wall layer 155 may be removed to expose the second lateral wall layer 153 and a part of the first lateral wall layer 151 may be removed. Since the second lateral wall layer 153 has the different etching rate from that of the data storing layer 133, during the etching of the data storing layer 133, the second lateral wall layer 153 is not removed and remains to protect the third stacked body C and the second stacked body B.

Referring to FIG. 6E, step ST5 may include a step of removing a part of the tunnel insulating layer 135 exposed through the source area SA. In this case, the etching material may be introduced through the slit SI and the source area SA. The etching of the tunnel insulating layer 135 is performed until the lateral wall of the channel layer CH is exposed. An etching area of the tunnel insulating layer 135 may be dug between the second source layer S2 and the channel layer CH and between the first source layer S1 and the channel layer CH and extended.

During the etching of the tunnel insulating layer 135, the second lateral wall layer 153 may be removed to expose the first lateral wall layer 151 and a part of the first blocking insulating layer 131 may be removed. Since the first lateral wall layer 151 has the different etching rate from that of the tunnel insulating layer 135, during the etching of the tunnel insulating layer 135, the first lateral wall layer 151 is not removed and remains to protect the third stacked body C and the second stacked body B.

The lateral wall of the channel layer CH and the first and second source layers S1 and S2 may be exposed through the source area SA by performing step ST5. Further, during the performance of step ST5, a part of the multilayered memory layer between the second source layer S2 and the channel layer CH and a part of the multilayered memory layer between the first source layer S1 and the channel layer CH may be removed. Accordingly, a first ring-type recess RA1 may be formed between the second source layers S2 and the channel layer CH, and a second ring-type recess RA2 may be formed between the first source layers S1 and the channel layer CH.

The multilayered memory layer is separated into a first multilayer memory pattern ML1 and a second multilayer memory pattern ML2 by the source area SA.

Referring to FIG. 3, after step ST5, step ST7 of replacing the sacrificial source layer with a contact source layer may be performed.

Figure 7B:
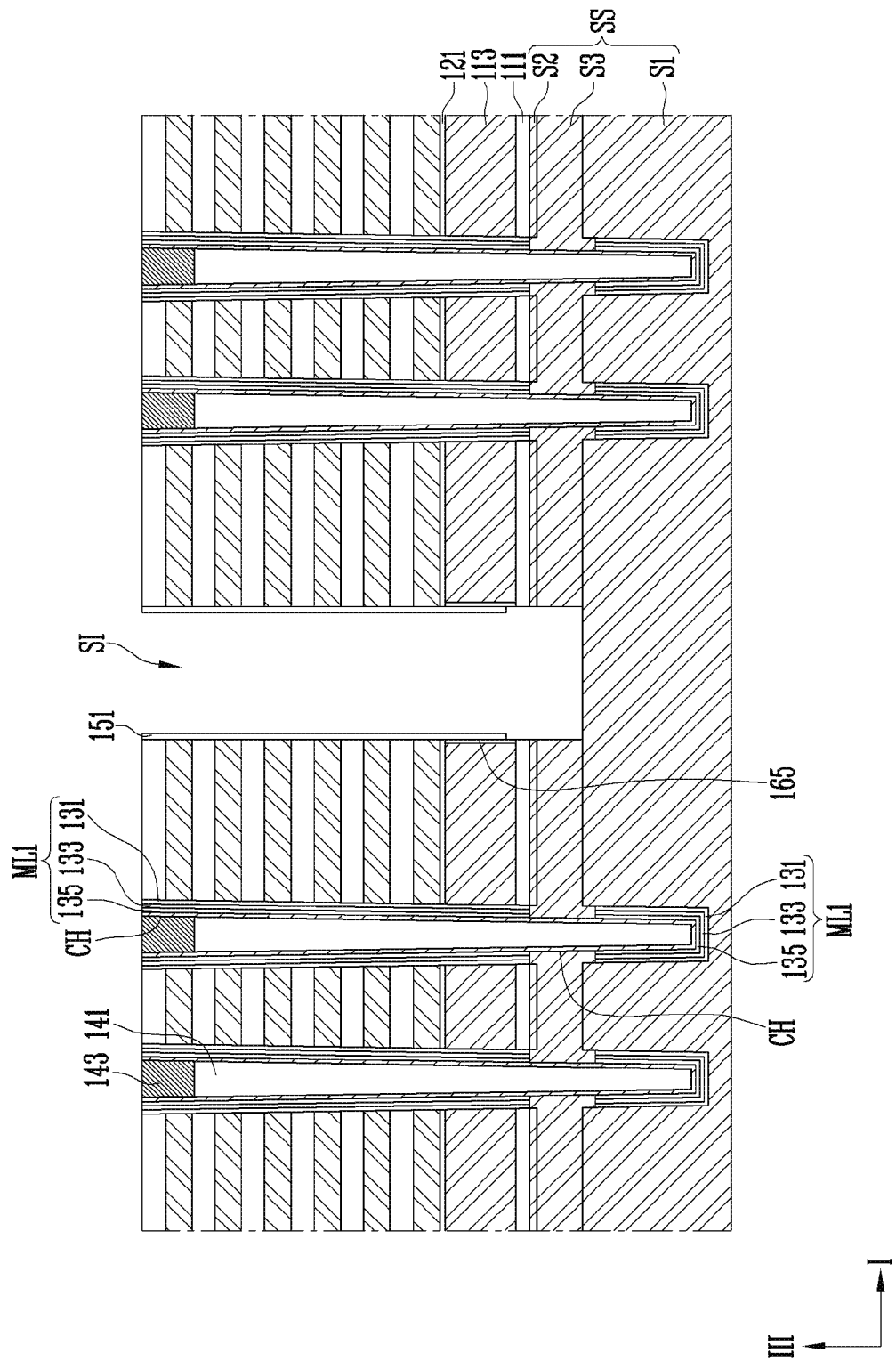

FIGS. 7A and 7B are cross-sectional views for describing step ST7 of the method illustrated in FIG. 3.

Referring to FIG. 7A, a contact source layer S3 formed in step ST7 is in direct contact with the lateral wall of the channel layer CH and the first and second source layers S1 and S2 exposed through the source area SA. The contact source layer S3 may be formed of a doped silicon layer including the first conductive type impurities. The contact source layer S3 is formed to be filled in the first and second ring-type recesses.

The contact source layer S3 may be formed by using a selective growth method (for example, Selective Epitaxial Growth (SEG)) or a non-selective deposition method (for example, Chemical Vapor Deposition (CVD)). When the selective growth method is used, the channel layer CH and the first and second source layers S1 and S2 may serve as seed layers. When the non-selective deposition method is used, the contact source layer S3 may be formed on the first lateral wall layer 151 inside the slit SI.

Referring to FIG. 7B, step ST7 may further include a step of removing a part of the contact source layer S3 inside the slit SI.

Through step ST7, the contact source layer S3 may be remained only in a space between the first source layer S1 and the second source layer S2. In the meantime, the lateral walls of the first lateral wall layer 151, the second source layer S2, and the first source layer S1 may be exposed.

The first and second source layers S1 and S2 and the residual contact source layer S3 define a source structure SS. The contact source layer S3 of the source structure SS is insulated from the first conductive layer 113 by the gate insulating layer 111.

Referring to FIG. 3, after step ST7, step ST9 for replacing the first material layers or the second material layers with the third material layers may be performed. When the first material layers are insulating materials for sacrifice and the second material layers are insulating materials for an interlayer insulating layer, the first material layers may be replaced with the third material layers. In this case, the third material layers may be formed of a conductive material having lower resistance than that of the first conductive layer. When the first material layers are conductive patterns and the second material layers are material layers for sac-rifice, the second material layers may be replaced with the third material layers. In this case, the third material layers may be insulating materials. Hereinafter, the case where the first material layers are replaced with the third material layers is exemplified, but the present disclosure is not limited thereto.

Figure 8A:
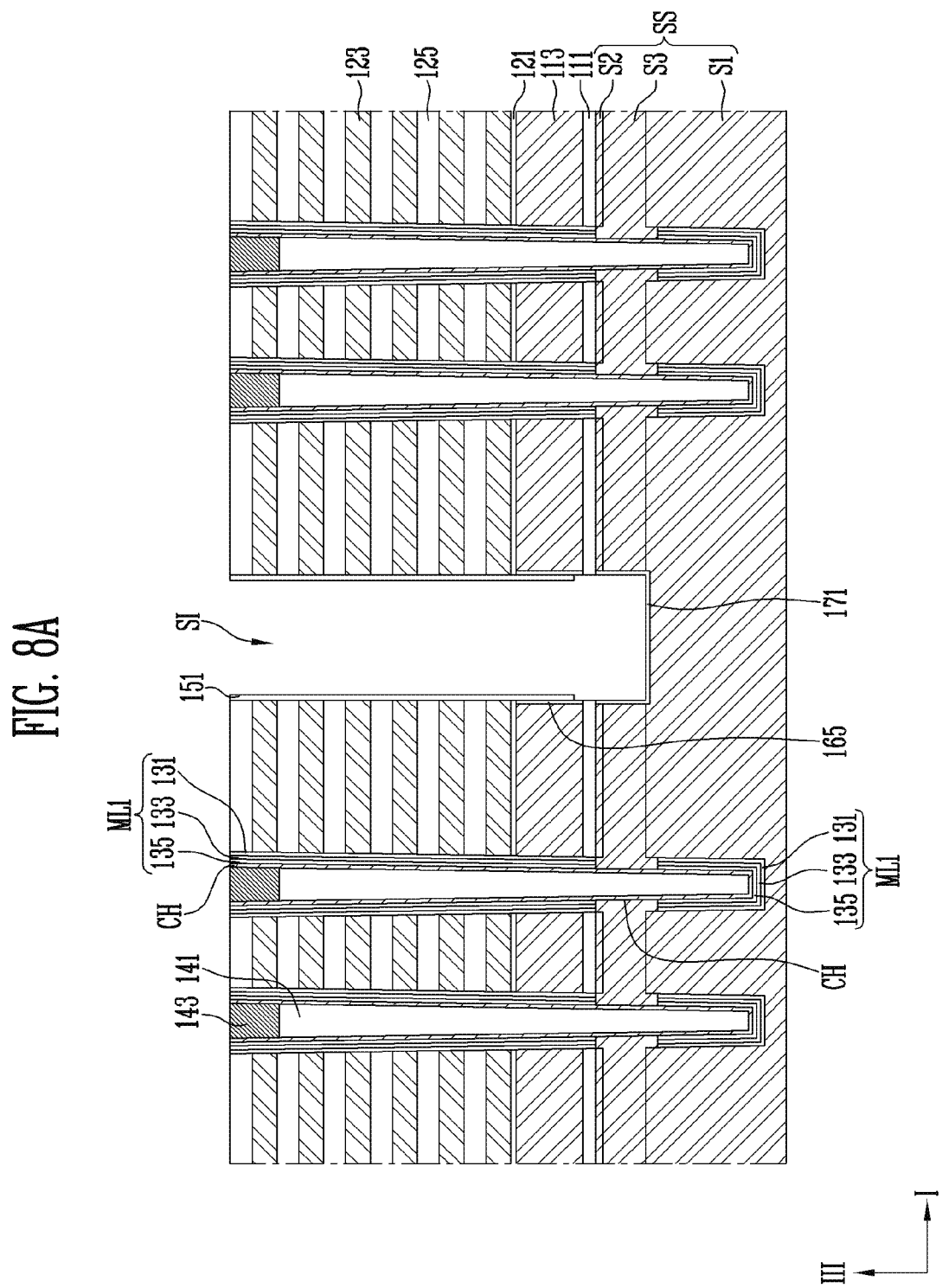
Figure 8C:
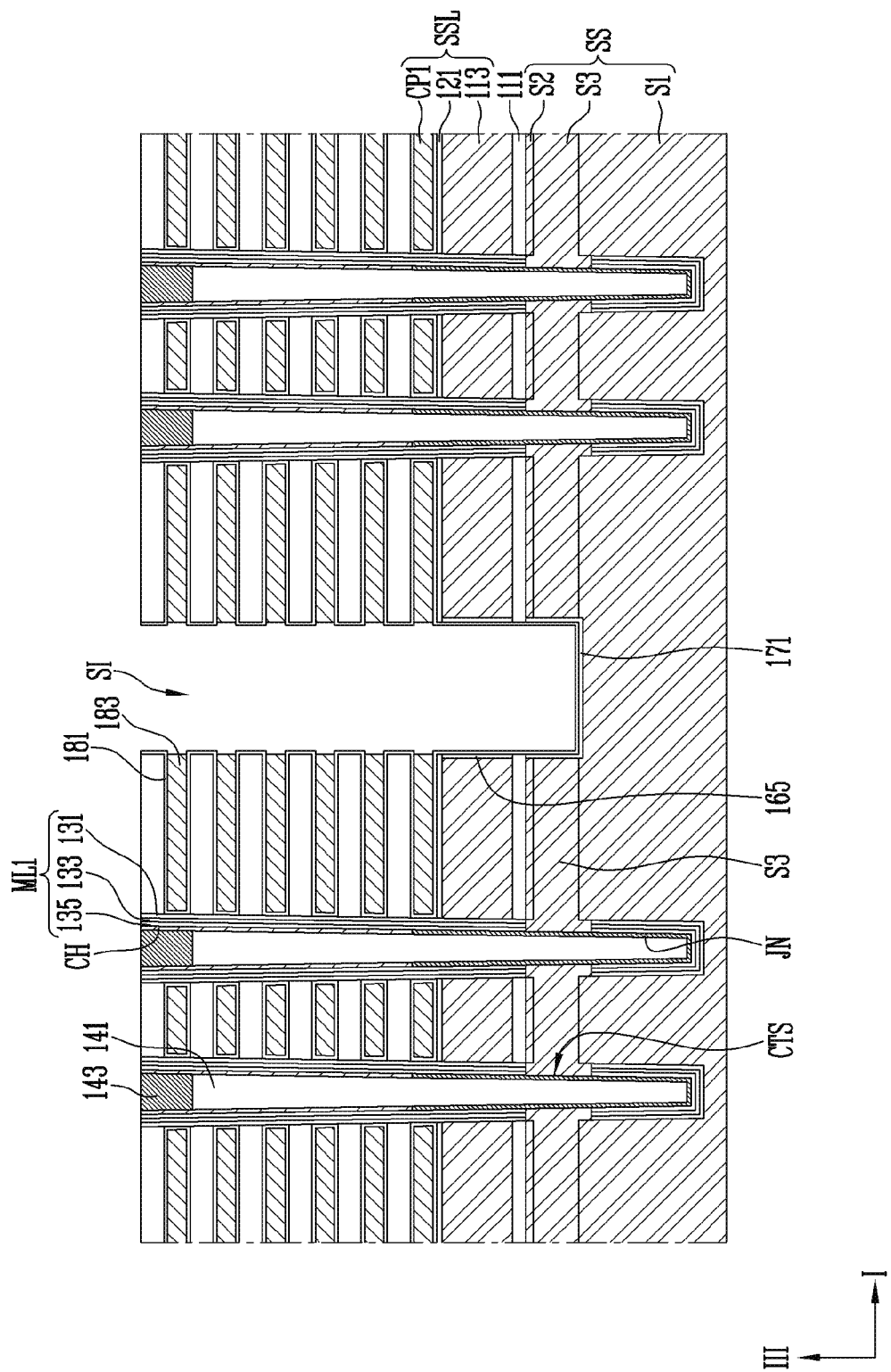

FIGS. 8A to 8C are cross-sectional views for describing step ST9 of the method illustrated in FIG. 3.

Referring to FIG. 8A, before step ST9 is performed, a second buffer layer 171 may be formed by oxidizing a surface of each of the first and second source layers S1 and S2 and the contact source layer S3 exposed through the slit SI.

Referring to FIG. 8B, step ST9 may include a step of forming openings OP, which exposes the first multilayer memory pattern ML1, between the second material layers 125 by selectively removing the first material layers 123.

Referring to FIG. 8C, step ST9 may include a step of filling the openings with the third material layers 183 formed of a conductive material having lower resistance than that of the first conductive layer 113. The third material layers 183 may correspond to the conductive patterns CP1 to CPk described with reference to FIG. 2. The lowermost layer among the third material layers 183, the first conductive layer 113, and the interface layer 121 may form the source select line SSL.

The conductive material forming the third material layers 183 may also be formed inside the slit SI, as well as inside the openings. In this case, the conductive material formed in the slit SI may be removed by an etching process. In this case, the first and second source layers S1 and S2 and the contact source layer S3 may be protected by the first buffer layer 165 and the second buffer layer 171.

Before the third material layers 183 are formed, a second blocking insulating layer 181 may be further formed along a surface of each of the openings. The second blocking insulating layer 181 may reinforce a function of the first blocking insulating layer 131. The second blocking insulating layer 181 may be formed of a high dielectric insulating layer. For example, the second blocking insulating layer 181 may include an aluminum oxide layer. The aluminum oxide layer may be deposited in an amorphous state and then be crystallized through a heat treatment process.

The heat treatment process may be performed so that the first conductive type impurities inside the first and second source layers S1 and S2 and the contact source layer S3 are diffused into the channel layer CH. Accordingly, a source junction JN may be formed inside the channel layer CH. The source junction JN may be formed by using a heat treatment process for forming the second blocking insulating layer 181, or may be formed by additionally performing a separate heat treatment process.

According to the example of an embodiment of the present disclosure, a distance between the contact surface CTS, which is defined between the channel layer CH and the contact source layer S3, and the first conductive layer 113 of the source select line SSL may be minimized. As a result, the source junction JN may be easily expanded into the channel layer CH to face the lateral walls of the first conductive layer 113 and the lowermost layer of the third material layer 183 which may be the second conductive layer CP1. In order to secure a characteristic of an erase operation, the source junction JN may be extended up to a height greater than that of the first conductive layer 113 from the contact surface CTS.

Referring to FIG. 3, after step ST9, step S11 of injecting impurities may be performed.

Figure 9B:
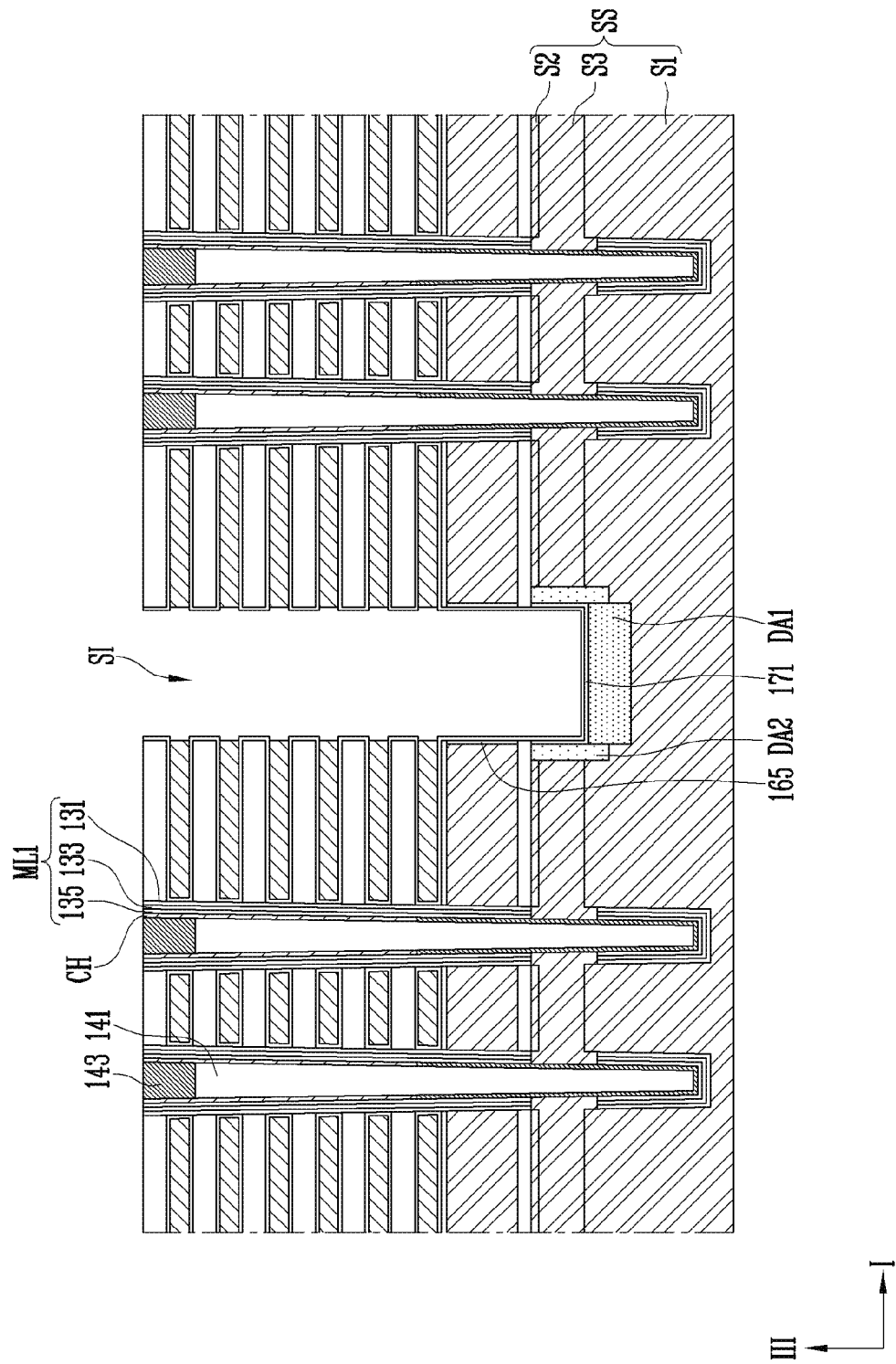

FIGS. 9A and 9B are cross-sectional views for describing step ST11 illustrated in FIG. 3.

Referring to FIG. 9A, step ST11 may include a step of forming a second doping area DA2 by injecting the first conductive type impurities through the slit SI. The second doping area DA2 may be formed through the slit SI by injecting the first conductive type impurities toward inside each of the first and second source layers S1 and S2 and the contact source layer S3 from the surfaces of the first and second source layers S1 and S2 and contact source layer S3 which are exposed through the slit SI.

The second doping area DA2 may include the first conductive type impurities with the third concentration as described with reference to FIG. 2. When the second doping area DA2 is formed, a tilt ion injection process may be performed to inject the first conductive type impurities into the contact source layer S3 and the second source layer S2 from the lateral walls of the contact source layer S3 and the second source layer S2 which are in contact with the lateral wall of the slit SI.

Referring to FIG. 9B, step ST11 may include a step of forming a first doping area DA1 by injecting the first conductive type impurities through the slit SI. The first doping area DA1 may be formed by injecting the first conductive type impurities toward inside the first source layer S1 from the surface of the first source layer S1 exposed through the bottom surface of the slit SI.

The first doping area DA1 may include the first type conductive impurities with the second concentration as described with reference to FIG. 2.

Referring to FIG. 3, after step ST11, step ST13 of forming a source contact line 197 may be performed.

FIG. 10 is a cross-sectional view for describing step ST13 of the method illustrated in FIG. 3.

Referring to FIG. 10, step ST13 may include a step of forming a lateral wall insulating layer 195 on the lateral wall of the slit SI. The lateral wall insulating layer 195 is removed from the bottom surface of the slit SI.

Step ST13 includes a step of forming the source contact line 197 filled inside the slit SI. The source contact line 197 is surrounded by the lateral wall insulating layer 195, and passes through the second blocking insulating layer 181 and the second buffer layer 171 to be in contact with the first doping area DA1.

In the example of an embodiment of the present disclosure, a structure of the source select line is designed so that the source junction is easily extended up to a height of the source select line, thereby improving reliability of an operation of the semiconductor device.

Figure 11:
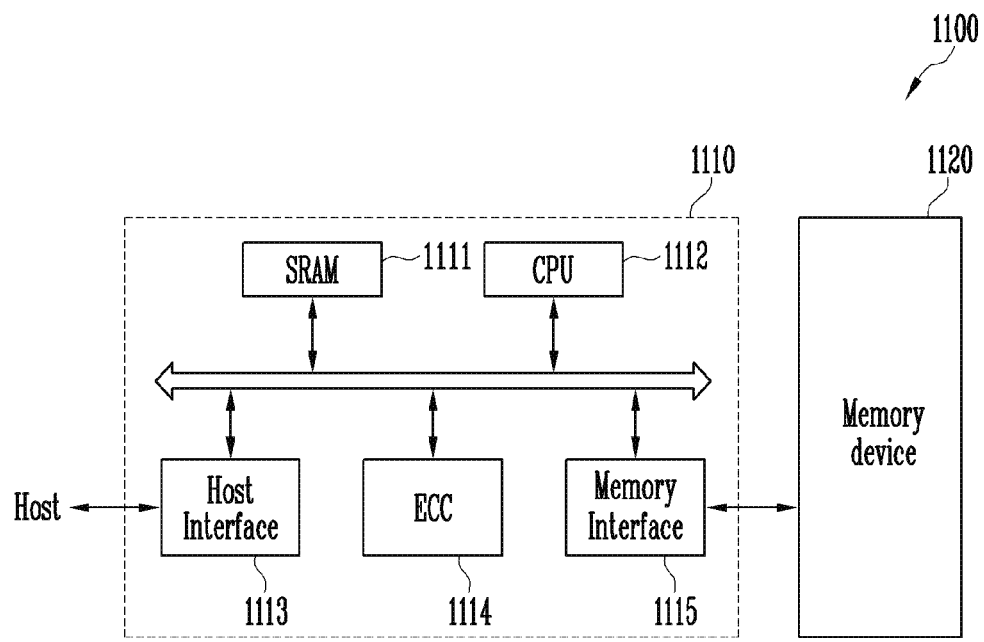
FIG. 11 is a block diagram illustrating a configuration of a memory system according to an example of an embodiment of the present disclosure.

FIG. 11 is a block diagram illustrating a configuration of a memory system according to an example of an embodiment of the present disclosure.

Referring to FIG. 11, a memory system 1100 according to the example of an embodiment of the present disclosure includes a memory device 1120 and a memory controller 1110.

The memory device 1120 may have the structures described with reference to FIGS. 1 to 2. The memory device 1120 may be a multi-chip package formed of a plurality of flash memory chips.

The memory controller 1110 may be configured to control the memory device 1120, and may include a Static Random Access Memory (SRAM) 1111, a Central Processing Unit (CPU) 1112, a host interface 1113, an Error Correction Code (ECC) 1114, and a memory interface 1115. The SRAM 1111 is used as an operation memory of the CPU 1112, the CPU 1112 performs a general control operation for a data exchange of the memory controller 1110, and a host interface 1113 includes a data exchange protocol of a host connected with the memory system 1100. Further, the ECC 1114 detects and corrects an error included in data read from the memory device 1120, and the memory interface 1115 performs interfacing with the memory device 1120. In addition, the memory controller 1110 may further include a Read Only Memory (ROM) and the like for storing code data for interfacing with the host.

The memory system 1100 may be a memory card or a Solid State Disk (SSD) in which the memory device 1120 is combined with the memory controller 1110. For example, when the memory system 1100 is an SSD, the memory controller 1110 may communicate with an external device (for example, the host) through one of various interface protocols, such as Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 12:
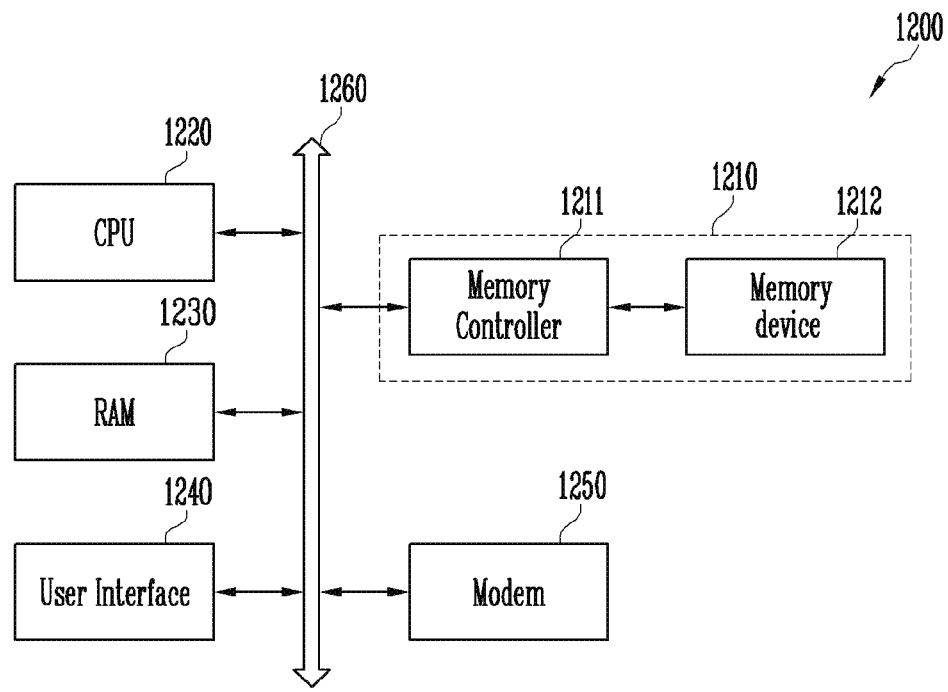
FIG. 12 is a block diagram illustrating a configuration of a computing system according to an example of an embodiment of the present disclosure.

FIG. 12 is a block diagram illustrating a configuration of a computing system according to an example of an embodiment of the present disclosure.

Referring to FIG. 12, a computing system 1200 according to an embodiment of the present disclosure may include a CPU 1220, a Random Access Memory (RAM) 1230, a user interface 1240, a modem 1250, and a memory system 1210, which are electrically connected to a system bus 1260. Further, in a case where the computing system 1200 is a mobile device, the computing system 1200 may further include a battery for supplying an operational voltage to the computing system 1200, and may further include an application chip-set, a CMOS image sensor CIS, a mobile DRAM, and the like.

The memory system 1210 may be formed of a memory device 1212 and a memory controller 1211 as previously described with reference to FIG. 11.

The technical spirit of the present disclosure has been described according to the examples of the embodiments, but the examples of the embodiments have been described herein for the purposes of illustration and do not limit the present disclosure. Further, those skilled in the art will appreciate that the various examples of the embodiments may be made within the technical spirit of the present disclosure.

What is claimed is:

1. A method of manufacturing a semiconductor device, comprising:

forming a stack group including a first source layer, a sacrificial source layer on the first source layer, a gate insulating layer on the sacrificial source layer, a first conductive layer on the gate insulating layer, and first material layers and second material layers alternately stacked on the first conductive layer;

forming a channel layer which is extended into the first source layer while passing through the first material layers and the second material layers and is surrounded by a multilayered memory layer;

forming a first through portion which passes the first material layers and the second material layers by selectively etching the first material layers and the second material layers with a first etching material before the first conductive layer is passed through;

forming a slit which is extended from the first through portion and passes through the first conductive layer and the gate insulating layer; and replacing the sacrificial source layer with a contact source layer through the slit, the contact source layer being in direct contact with the first source layer and the channel layer and being insulated from the first conductive layer by the gate insulating layer.

2. The method of claim 1, wherein the stack group further includes a first passivation layer disposed between the first source layer and the sacrificial source layer, a second passivation layer and a second source layer sequentially stacked between the sacrificial source layer and the gate insulating layer, and an interface layer disposed between a stacked body of the first and second material layers and the first conductive layer.

3. The method of claim 2, wherein the first passivation layer, the second passivation layer, the second material layers, and the interface layer are formed of an insulating material.

4. The method of claim 3, wherein the interface layer is formed to be thinner than the second material layers and the gate insulating layer.

5. The method of claim 2, wherein the first source layer, the second source layer, the contact source layer, and the first conductive layer are formed of doped silicon layers including first conductive type impurities.

6. The method of claim 5, wherein the first conductive type impurities include n-type impurities.

7. The method of claim 2, wherein the first source layer is disposed to be farthest from the first conductive layer than the second source layer and contact source layer.

8. The method of claim 2, wherein the contact source layer is disposed between the first source layer and the second source layer.

9. The method of claim 2, wherein the forming of the slit includes:
    forming a second through portion which is connected to the first through portion and passes through the first conductive layer by etching the first conductive layer with a second etching material before the gate insulating layer is passed through;
    forming a first buffer layer by oxidizing a lateral wall of the first conductive layer exposed through the second through portion; and
    forming a third through portion which is connected to the second through portion and exposes the sacrificial source layer by etching the gate insulating layer, the second source layer, and the second passivation layer.

10. The method of claim 2, wherein the second source layer is formed to be thinner than the first conductive layer and each of the first material layers and the second material layers.

11. The method of claim 2, wherein the replacing of the sacrificial source layer with the contact source layer through the slit includes:
    opening a source area between the first passivation layer and the second passivation layer by removing the sacrificial source layer exposed through the slit;
    removing a part of the multilayered memory layer between the first source layer and the second source layer, and the first passivation layer and the second passivation layer so that a lateral wall of the channel layer and the first and second source layers are exposed through the source area; and
    forming the contact source layer that is in direct contact with the lateral wall of the channel layer and the first and second source layers exposed through the source area.

12. The method of claim 11, wherein in the removing of the part of the multilayered memory layer, a first ring-type recess is formed between the second source layer and the channel layer and a second ring-type recess is formed between the first source layer and the channel layer, and
    the contact source layer is formed to be filled in the first and second ring-type recesses.

13. The method of claim 1, wherein the first conductive layer is formed to be thicker than each of the first and second material layers.

14. The method of claim 1, further comprising:
    replacing the first material layers with third material layers formed of a conductive material having lower resistance than that of the first conductive layer through the slit.

15. The method of claim 1, further comprising:
    forming a source junction inside the channel layer by performing a heat treatment process so that first conductive type impurities included in the contact source layer and the first source layer are diffused into the channel layer.

16. The method of claim 15, wherein the source junction is extended to be higher than the first conductive layer from a contact surface between a lateral wall of the channel layer and the contact source layer.

17. The method of claim 1, further comprising:
    forming a second buffer layer by oxidizing a surface of each of the contact source layer and the first source layer exposed through the slit;
    forming a first doping area by injecting first conductive type impurities from a surface of the first source layer that is in contact with a bottom surface of the slit toward an inner side of the first source layer;
    forming a lateral wall insulating layer on a lateral wall of the slit; and
    forming a source contact line which is surrounded by the lateral wall insulating layer, is filled inside the slit, and is in contact with the first doping area while passing through the second buffer layer.

18. The method of claim 17, further comprising:
    forming a second doping area by injecting the first conductive type impurities from a lateral wall of the contact source layer that is in contact with a lateral wall of the slit toward an inner side of the contact source layer.

19. The method of claim 18, wherein the first conductive type impurities are distributed with a first concentration inside a source structure including the contact source layer and the first source layer, are distributed with a second concentration higher than the first concentration inside the first doping area, and are distributed with a third concentration that is higher than the first concentration and is lower than the second concentration inside the second doping area.

* * * * *